US012632758B2

(12) United States Patent

Sete et al.

(10) Patent No.: US 12,632,758 B2

(45) Date of Patent: May 19, 2026

(54) CALIBRATION OF ISWAP GATE ON A SUPERCONDUCTING QUANTUM PROCESSING UNIT

(71) Applicant: Rigetti & Co, LLC, Berkeley, CA (US)

(72) Inventors: Eyob A Sete, Walnut Creek, CA (US); Shobhan Kulshreshtha, Berkeley, CA (US)

(73) Assignee: Rigetti & Co, LLC, Berkeley, CA (US)

( * ) Notice: Subject to any disclaimer, the term of this patent is extended or adjusted under 35 U.S.C. 154(b) by 98 days.

(21) Appl. No.: 18/626,838

(22) Filed: Apr. 4, 2024

(65) Prior Publication Data

US 2024/0311671 A1 Sep. 19, 2024

Related U.S. Application Data

(63) Continuation of application No. PCT/US2022/046419, filed on Oct. 12, 2022.

(Continued)

(51) Int. Cl.
*G06N 10/20* (2022.01)
*B82Y 10/00* (2011.01)
(Continued)

(52) U.S. Cl.
CPC .............. *G06N 10/20* (2022.01); *B82Y 10/00* (2013.01); *G06N 10/40* (2022.01); *G06N 10/70* (2022.01);
(Continued)

(58) Field of Classification Search
CPC ........ G06N 10/20; G06N 10/40; G06N 10/70; H03K 19/195; H10D 48/3835; B82Y 10/00; H10N 60/12
(Continued)

(56) References Cited

U.S. PATENT DOCUMENTS 10,352,992 B1 7/2019 Zeng et al.
10,483,980 B2 11/2019 Sete et al.
(Continued)

FOREIGN PATENT DOCUMENTS

WO 2023064369 4/2023

OTHER PUBLICATIONS

KIPO, International Search Report and Written Opinion mailed Feb. 14, 2023, in PCT/US2022/046419, 10 pgs.
(Continued)

*Primary Examiner* — Arnold M Kinkead

(74) *Attorney, Agent, or Firm* — Henry Patent Law Firm PLLC

(57) ABSTRACT

In a general aspect, iSWAP gates are calibrated on a superconducting quantum processing unit. In some aspects, initial values of control parameters to apply the iSWAP gate on a pair of qubits defined by first and second qubit devices of the superconducting quantum processing unit are identified. Phase tracking devices associated with the first and second qubit devices of the superconducting quantum processing unit are initialized. After initiating the phase tracking devices, shifts in local phases of the pair of qubits are determined based on one or more applications of the iSWAP gate to the pair of qubits. The one or more applications of the iSWAP gate to the pair of qubits is performed using the initial values of the control parameters. Updated values of one or more of the control parameters are generated based on the shifts in local phases and outputs of the phase tracking devices.

18 Claims, 17 Drawing Sheets

Related U.S. Application Data

(60) Provisional application No. 63/254,772, filed on Oct. 12, 2021, provisional application No. 63/314,181, filed on Feb. 25, 2022, provisional application No. 63/314,818, filed on Feb. 28, 2022.

(51) Int. Cl.

| | |
|---|---|
| *G06N 10/40* | (2022.01) |
| *G06N 10/70* | (2022.01) |
| *H03K 19/195* | (2006.01) |
| *H10D 48/00* | (2025.01) |
| *H10N 60/12* | (2023.01) |

(52) U.S. Cl.
CPC ....... *H03K 19/195* (2013.01); *H10D 48/3835* (2025.01); *H10N 60/12* (2023.02)

(58) Field of Classification Search
USPC .............. 326/1; 333/99 S; 505/864; 307/277
See application file for complete search history.

(56) References Cited

U.S. PATENT DOCUMENTS

| | | | |
|---|---|---|---|
| 2021/0304054 A1 * | 9/2021 | Neill ...................... | G06N 10/20 |
| 2023/0342651 A1 * | 10/2023 | Miao ...................... | G06N 10/40 |

OTHER PUBLICATIONS

"Numerically-controlled oscillator", Wikipedia, https://en.wikipedia. org/wiki/Numerically-controlled_oscillator, Jun. 20, 2021, 5 pgs.

Abrams , et al., "Implementation of the XY interaction family with calibration of a single pulse", arXiv:1912.04424, Dec. 9, 2019, 13 pgs.

Arute , et al., "Supplementary Information for: Quantum supremacy using a programmable superconducting processor", arXiv:1910. 11333, Dec. 28, 2019, 67 pgs.

Ganzhorn , et al., "Benchmarking the noise sensitivity of different parametric two-qubit gates in a single superconducting quantum computing platform", arXiv:2005.05696v2, May 2020, 25 pgs.

Magesan , et al., "Robust randomized benchmarking of quantum processes", arXiv:1009.3639v1, Sep. 19, 2010, 5 pgs.

Sete , et al., "Parametric-resonance entangling gates with a tunable coupler", arXiv:2104.03511, Sep. 7, 2021, 14 pgs.

Sung , et al., "Realization of high-fidelity CZ and ZZ-free iSWAP gates with a tunable coupler", arXiv:2011.01261v3, Jun. 17, 2021, 34 pgs.

EPO, Extended European Search Report issued in Application No. 22881713.6 on Jul. 22, 2025, 11 pages.

Neeley, et al., "Process tomography of quantum memory in a Josephson-phase qubit coupled to a two-level state", nature physics, vol. 4, Jul. 2008, 4 pgs.

* cited by examiner

700

710

720

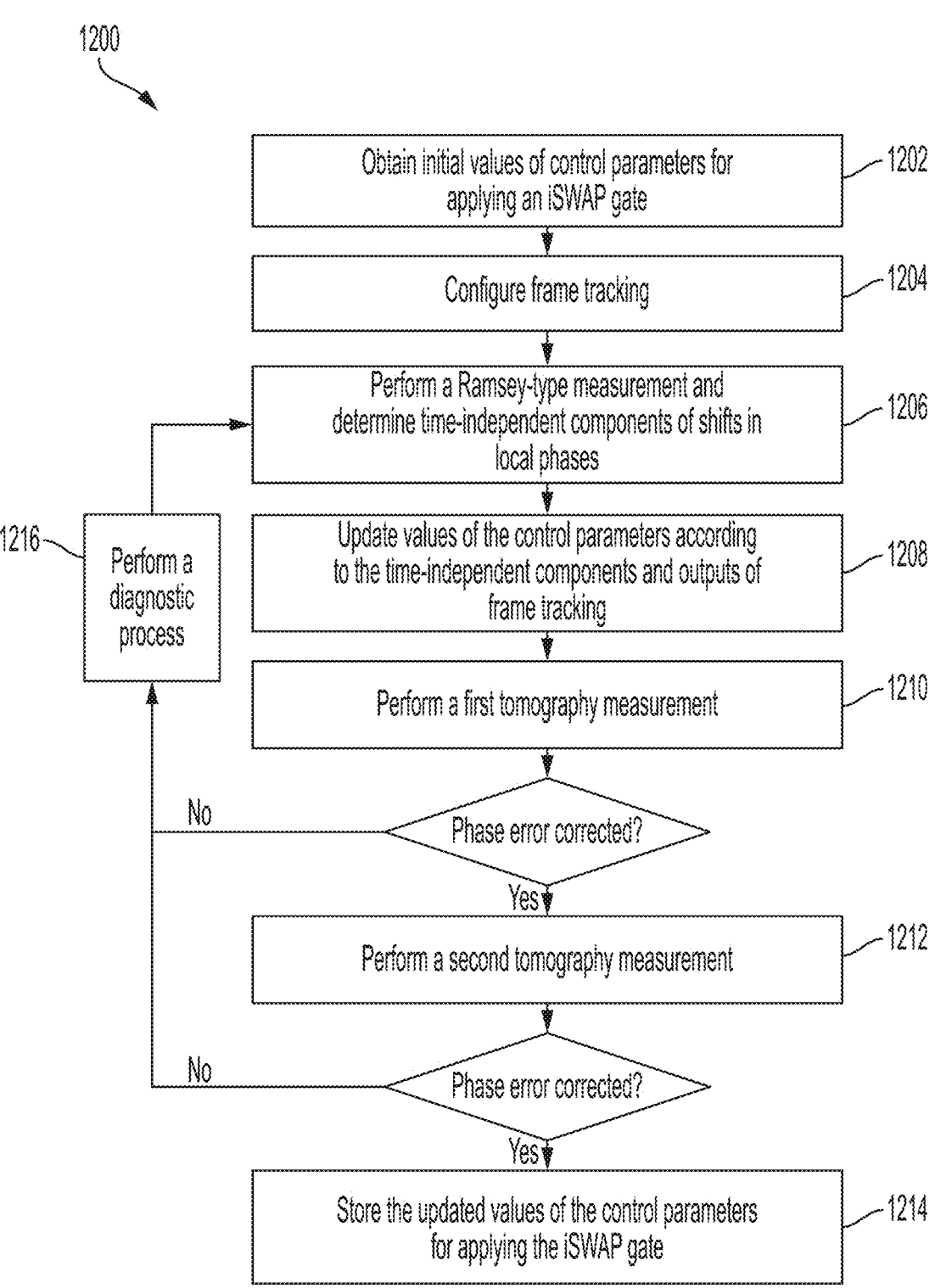

1200

Obtain initial values of control parameters for applying an iSWAP gate ⟶ 1202

Configure frame tracking ⟶ 1204

Perform a Ramsey-type measurement and determine time-independent components of shifts in local phases ⟶ 1206

1216 — Perform a diagnostic process

Update values of the control parameters according to the time-independent components and outputs of frame tracking ⟶ 1208

Perform a first tomography measurement ⟶ 1210

Phase error corrected? — No

Yes

Perform a second tomography measurement ⟶ 1212

Phase error corrected? — No

Yes

Store the updated values of the control parameters for applying the iSWAP gate ⟶ 1214

FIG. 12

CALIBRATION OF ISWAP GATE ON A SUPERCONDUCTING QUANTUM PROCESSING UNIT

CROSS-REFERENCE TO RELATED APPLICATIONS

This application is a continuation of International Application PCT/US2022/046419, filed Oct. 12, 2022, entitled "Calibration of iSWAP Gate on a Superconducting Quantum Processor," which claims priority to U.S. Provisional Patent Application No. 63/254,772, filed Oct. 12, 2021, entitled "Calibration of iSWAP Gate on a Superconducting Quantum Processor"; to U.S. Provisional Patent Application No. 63/314,181, filed Feb. 25, 2022, entitled "Calibration of iSWAP Gates on a Superconducting Quantum Processing Unit"; and to U.S. Provisional Patent Application No. 63/314,818, filed Feb. 28, 2022, entitled "Calibration of iSWAP Gates on a Superconducting Quantum Processing Unit." The above-referenced priority documents are incorporated herein by reference in their entirety.

TECHNICAL FIELD

The following description relates to calibration of iSWAP gates on a superconducting quantum processing unit.

BACKGROUND

Quantum computers can perform computational tasks by storing and processing information within quantum states of quantum systems. For example, qubits (i.e., quantum bits) can be stored in, and represented by, an effective two-level sub-manifold of a quantum coherent physical system. A variety of physical systems have been proposed for quantum computing applications. Examples include superconducting circuits, trapped ions, spin systems, and others.

BRIEF DESCRIPTION OF THE DRAWINGS

FIG. 12 is a flow chart of an example process for iSWAP gate calibration.

DETAILED DESCRIPTION

Figure 1:
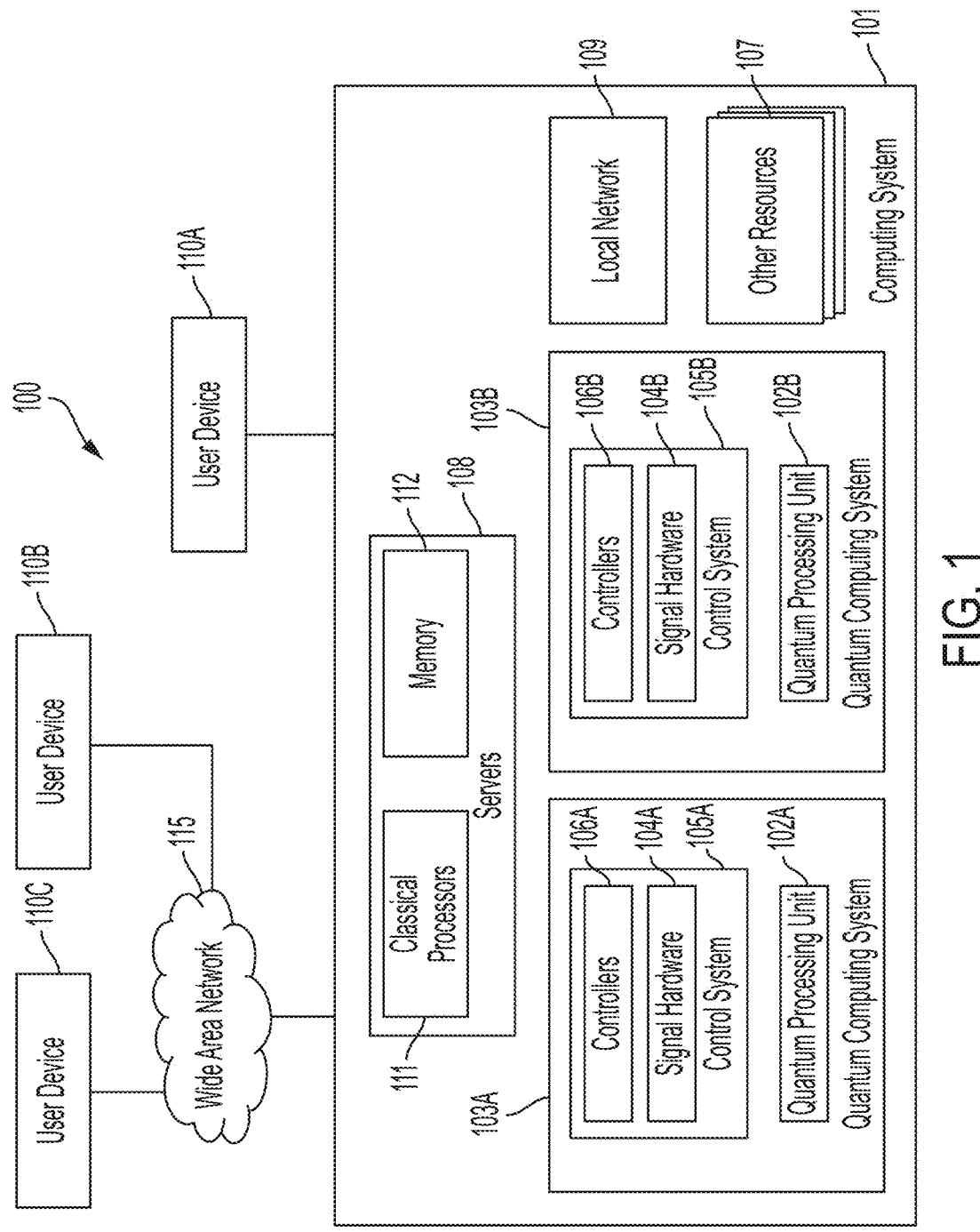
FIG. 1 is a block diagram of an example computing environment.

In some aspects of what is described here, quantum logic gates are calibrated for execution on a superconducting quantum processing unit. The quantum logic gates can include, for example, iSWAP gates or other types of multi-qubit quantum logic gate that introduce local phase errors on the qubits to which the quantum logic gate is applied. In some implementations, a calibration process determines all or part of the phase corrections needed to correct the local phase errors, and the phase corrections can be stored as control parameters that are used when the quantum logic gate is executed in the superconducting quantum processing unit. In some cases, the calibration process determines a time-independent component of the phase corrections, and phase tracking devices are used to determine a time-dependent component of the phase correction. When the quantum logic gate is executed, the time-independent component for each qubit can be determined from the control parameters, and the time-dependent component can be determined from the phase tracking devices, and the two components can be combined to determine the appropriate phase correction (which can be applied, e.g., as virtual Z rotations on the qubit).

In some implementations, a quantum computing system executes quantum programs that include a sequence of native quantum logic gates, e.g., single-qubit native quantum logic gates, two-qubit native quantum logic gates, or other native quantum logic gates, that can be directly executed on the superconducting quantum processing unit. In some implementations, a sequence of native quantum logic gates corresponds to one or more iSWAP gates executed (e.g., on the same pair of qubit devices) at different time steps in the quantum program. In these and other cases, the fidelity and repeatability of the iSWAP gate is important for the overall execution of the quantum program. Accordingly, improving calibration of the iSWAP gate can lead to improved performance of the quantum computing system and fidelity of quantum program execution.

In some implementations, two-qubit quantum logic gates are defined using a computational basis of a multi-qubit system in computational subspaces. The computational basis states are typically defined in a reference frame of a rotating frequency of a qubit drive signal of a qubit device (e.g., a logical frame). In some implementations, an iSWAP-like gates are quantum logic gates that have swap angles of close to π/2 and have finite conditional phases (e.g., the phase of the quantum state|11⟩ state of a two-qubit system). In this case, an execution of an iSWAP-like gate causes shifts in local phases in the logical frames due to unmatched rotating frame frequencies of the respective qubits. On the other hand, two-qubit quantum logic gates that do not involve energy exchange within the computational subspaces (e.g., Controlled-Z (CZ) gates) generally do not introduce shifts in local phases. In some implementations, the shifts in local phases, which are generally time-dependent, can be corrected by applying virtual Z rotation operations to the qubits defined by qubit devices when the iSWAP gate is executed. For example, by communicating drive signals with negative phases to the qubit devices to cancel the respective shifts in local phases (e.g., local phase errors) caused by the execution of the iSWAP gate. The phase corrections applied on the drive signals can be determined based on parameters obtained during a calibration process, as well as output obtained from phase tracking devices. For instance, the calibration process and the output from the phase tracking device can provide a time-independent component of the phase correction.

In some implementations, the systems and techniques described here can provide technical advantages and improvements. In some cases, a calibration process can utilize phase tracking devices to improve the overall performance of calibrated quantum logic gates (e.g., iSWAP gates). For instance, the calibration process can lead to improved repeatability, gate fidelity, and other performance parameters of quantum logic gates. In some cases, no additional control signals (e.g., qubit drive signals) are needed to perform "actual" Z rotation operations on qubit devices (e.g., by executing three single-qubit native quantum logic gates) to correct local phase errors when an iSWAP gate is performed. Omitting actual Z rotations can provide an improvement because virtual Z rotations generally do not degrade gate performance (e.g., gate fidelity) of the iSWAP gate. In particular, virtual Z rotations do not introduce additional incoherent noise or coherent noise because, for instance, they do not affect the overall gate time (duration) of the iSWAP gate. In some implementations, the techniques and systems in the present disclosure can provide a scalable calibration process for iSWAP gates in a superconducting quantum processing unit. In some cases, a combination of these and potentially other advantages and improvements may be obtained.

FIG. 1 is a block diagram of an example computing environment 100. The example computing environment 100 shown in FIG. 1 includes a computing system 101 and user devices 110A, 110B, 110C. A computing environment may include additional or different features, and the components of a computing environment may operate as described with respect to FIG. 1 or in another manner.

The example computing system 101 includes classical and quantum computing resources and exposes their functionality to the user devices 110A, 110B, 110C (referred to collectively as "user devices 110"). The computing system 101 shown in FIG. 1 includes one or more servers 108, quantum computing systems 103A, 103B, a local network 109, and other resources 107. The computing system 101 may also include one or more user devices (e.g., the user device 110A) as well as other features and components. A computing system may include additional or different features, and the components of a computing system may operate as described with respect to FIG. 1 or in another manner.

The example computing system 101 can provide services to the user devices 110, for example, as a cloud-based or remote-accessed computer system, as a distributed computing resource, as a supercomputer or another type of high-performance computing resource, or in another manner. The computing system 101 or the user devices 110 may also have access to one or more other quantum computing systems (e.g., quantum computing resources that are accessible through the wide area network 115, the local network 109, or otherwise).

The user devices 110 shown in FIG. 1 may include one or more classical processors, memory, user interfaces, communication interfaces, and other components. For instance, the user devices 110 may be implemented as laptop computers, desktop computers, smartphones, tablets, or other types of computer devices. In the example shown in FIG. 1, to access computing resources of the computing system 101, the user devices 110 send information (e.g., programs, instructions, commands, requests, input data, etc.) to the servers 108; and in response, the user devices 110 receive information (e.g., application data, output data, prompts, alerts, notifications, results, etc.) from the servers 108. The user devices 110 may access services of the computing system 101 in another manner, and the computing system 101 may expose computing resources in another manner.

In the example shown in FIG. 1, the local user device 110A operates in a local environment with the servers 108 and other elements of the computing system 101. For instance, the user device 110A may be co-located with (e.g., located within 0.5 to 1 km of) the servers 108 and possibly other elements of the computing system 101. As shown in FIG. 1, the user device 110A communicates with the servers 108 through a local data connection.

The local data connection in FIG. 1 is provided by the local network 109. For example, some or all of the servers 108, the user device 110A, the quantum computing systems 103A, 103B, and the other resources 107 may communicate with each other through the local network 109. In some implementations, the local network 109 operates as a communication channel that provides one or more low-latency communication pathways from the server 108 to the quantum computer systems 103A, 103B (or to one or more of the elements of the quantum computer systems 103A, 103B). The local network 109 can be implemented, for instance, as a wired or wireless Local Area Network, an Ethernet connection, or another type of wired or wireless connection. The local network 109 may include one or more wired or wireless routers, wireless access points (WAPs), wireless mesh nodes, switches, high-speed cables, or a combination of these and other types of local network hardware elements. In some cases, the local network 109 includes a software-defined network that provides communication among virtual resources, for example, among an array of virtual machines operating on the server 108 and possibly elsewhere.

In the example shown in FIG. 1, the remote user devices 110B, 110C operate remote from the servers 108 and other elements of the computing system 101. For instance, the user devices 110B, 110C may be located at a remote distance (e.g., more than 1 km, 10 km, 100 km, 1,000 km, 10,000 km, or farther) from the servers 108 and possibly other elements of the computing system 101. As shown in FIG. 1, each of the user devices 110B, 110C communicates with the servers 108 through a remote data connection.

The remote data connection in FIG. 1 is provided by a wide area network 115, which may include, for example, the Internet or another type of wide area communication network. In some cases, remote user devices use another type of remote data connection (e.g., satellite-based connections, a cellular network, a virtual private network, etc.) to access the servers 108. The wide area network 115 may include one or more internet servers, firewalls, service hubs, base stations, or a combination of these and other types of remote networking elements. Generally, the computing environment 100 can be accessible to any number of remote user devices.

The example servers 108 shown in FIG. 1 can manage interaction with the user devices 110 and utilization of the quantum and classical computing resources in the computing system 101. For example, based on information from the user devices 110, the servers 108 may delegate computational tasks to the quantum computing systems 103A, 103B, and the other resources 107; the servers 108 can then send information to the user devices 110 based on output data from the computational tasks performed by the quantum computing systems 103A, 103B, and the other resources 107.

As shown in FIG. 1, the servers 108 are classical computing resources that include classical processors 111 and memory 112. The servers 108 may also include one or more communication interfaces that allow the servers to communicate via the local network 109, the wide area network 115 and possibly other channels. In some implementations, the servers 108 may include a host server, an application server, a virtual server, or a combination of these and other types of servers. The servers 108 may include additional or different features, and may operate as described with respect to FIG. 1 or in another manner.

The classical processors 111 can include various kinds of apparatus, devices, and machines for processing data, including, by way of example, a microprocessor, a central processing unit (CPU), a graphics processing unit (GPU), an FPGA (field programmable gate array), an ASIC (application specific integrated circuit), or combinations of these. The memory 112 can include, for example, a random-access memory (RAM), a storage device (e.g., a writable read-only memory (ROM) or others), a hard disk, or another type of storage medium. The memory 112 can include various forms of volatile or non-volatile memory, media, and memory devices, etc.

Each of the example quantum computing systems 103A, 103B operates as a quantum computing resource in the computing system 101. The other resources 107 may include additional quantum computing resources (e.g., quantum computing systems, quantum simulators, or both) as well as classical (non-quantum) computing resources such as, for example, digital microprocessors, specialized co-processor units (e.g., graphics processing units (GPUs), cryptographic co-processors, etc.), special purpose logic circuitry (e.g., field programmable gate arrays (FPGAs), application-specific integrated circuits (ASICs), etc.), systems-on-chips (SoCs), etc., or combinations of these and other types of computing modules.

In some implementations, the servers 108 generate programs, identify appropriate computing resources (e.g., a QPU or QVM) in the computing system 101 to execute the programs, and send the programs to the identified resources for execution. For example, the servers 108 may send programs to the quantum computing system 103A, the quantum computing system 103B, or any of the other resources 107. The programs may include classical programs, quantum programs, hybrid classical/quantum programs, and may include any type of function, code, data, instruction set, etc.

In some instances, programs can be formatted as source code that can be rendered in human-readable form (e.g., as text) and can be compiled, for example, by a compiler running on the servers 108, on the quantum computing systems 103, or elsewhere. In some instances, programs can be formatted as compiled code, such as, for example, binary code (e.g., machine-level instructions) that can be executed directly by a computing resource. Each program may include instructions corresponding to computational tasks that, when performed by an appropriate computing resource, generate output data based on input data. For example, a program can include instructions formatted for a quantum computer system, a simulator, a digital microprocessor, co-processor or other classical data processing apparatus, or another type of computing resource.

In some cases, a quantum program may be expressed in a hardware-independent format. For example, quantum machine instructions may be provided in a quantum instruction language such as Quil, described in the publication "A Practical Quantum Instruction Set Architecture," arXiv: 1608.03355v2, dated Feb. 17, 2017, or another quantum instruction language. For instance, the quantum machine instructions may be written in a format that can be executed by a broad range of quantum processing units or simulators. In some cases, a program may be expressed in high-level terms of quantum logic gates or quantum algorithms, in lower-level terms of fundamental qubit rotations and controlled rotations, or in another form. In some cases, a program may be expressed in terms of control signals (e.g., pulse sequences, delays, etc.) and parameters for the control signals (e.g., frequencies, phases, durations, channels, etc.). In some cases, a program may be expressed in another form or format. In some cases, a program may utilize Quil-T, described in the publication "Gain deeper control of Rigetti quantum processors with Quil-T," available at https://medium.com/rigetti/gain-deeper-control-of-rigetti-quantum-processors-with-quil-t-ea8943061e5b dated Dec. 10, 2020.

In some implementations, the servers 108 include one or more compilers that convert programs between formats. For example, the servers 108 may include a compiler that converts hardware-independent instructions to binary programs for execution by the quantum computing systems 103A, 103B. In some cases, a compiler can compile a program to a format that targets a specific quantum resource in the computer system 101. For example, a compiler may generate a different binary program (e.g., from the same source code) depending on whether the program is to be executed by the quantum computing system 103A or the quantum computing system 103B.

In some cases, a compiler generates a partial binary program that can be updated, for example, based on specific parameters. For instance, if a quantum program is to be executed iteratively on a quantum computing system with varying parameters on each iteration, the compiler may generate the binary program in a format that can be updated with specific parameter values at runtime (e.g., based on feedback from a prior iteration, or otherwise); the parametric update can be performed without further compilation. In some cases, a compiler generates a full binary program that does not need to be updated or otherwise modified for execution.

In some implementations, the servers 108 generate a schedule for executing programs, allocate computing resources in the computing system 101 according to the schedule, and delegate the programs to the allocated computing resources. The servers 108 can receive, from each computing resource, output data from the execution of each program. Based on the output data, the servers 108 may generate additional programs that are then added to the schedule, output data that is provided back to a user device 110, or perform another type of action.

In some implementations, all or part of the computing environment operates as a cloud-based quantum computing (QC) environment, and the servers 108 operate as a host system for the cloud-based QC environment. The cloud-based QC environment may include software elements that operate on both the user devices 110 and the computer system 101 and interact with each other over the wide area network 115. For example, the cloud-based QC environment may provide a remote user interface, for example, through a browser or another type of application on the user devices 110. The remote user interface may include, for example, a graphical user interface or another type of user interface that obtains input provided by a user of the cloud-based QC environment. In some cases, the remote user interface includes, or has access to, one or more application programming interfaces (APIs), command line interfaces, graphical user interfaces, or other elements that expose the services of the computer system 101 to the user devices 110.

In some cases, the cloud-based QC environment may be deployed in a "serverless" computing architecture. For instance, the cloud-based QC environment may provide on-demand access to a shared pool of configurable computing resources (e.g., networks, servers, storage, applications, services, quantum computing resources, classical computing resources, etc.) that can be provisioned for requests from user devices 110. Moreover, the cloud-based computing systems 101 may include or utilize other types of computing resources, such as, for example, edge computing, fog computing, etc.

In an example implementation of a cloud-based QC environment, the servers 108 may operate as a cloud provider that dynamically manages the allocation and provisioning of physical computing resources (e.g., GPUs, CPUs, QPUs, etc.). Accordingly, the servers 108 may provide services by defining virtualized resources for each user account. For instance, the virtualized resources may be formatted as virtual machine images, virtual machines, containers, or virtualized resources that can be provisioned for a user account and configured by a user. In some cases, servers 108 include a container management and execution system that is implemented, for example, using KUBER-NETES® or another software platform for container management. In some cases, the cloud-based QC environment is implemented using a resource such as, for example, OPENSTACK®. OPENSTACK® is an example of a software platform for cloud-based computing, which can be used to provide virtual servers and other virtual computing resources for users.

In some cases, the server 108 stores quantum machine images (QMI) for each user account. A quantum machine image may operate as a virtual computing resource for users of the cloud-based QC environment. For example, a QMI can provide a virtualized development and execution environment to develop and run programs (e.g., quantum programs or hybrid classical/quantum programs). When a QMI operates on the server 108, the QMI may engage either of the quantum processor units 102A, 102B, and interact with a remote user device (110B or 110C) to provide a user programming environment. The QMI may operate in close physical proximity to, and have a low-latency communication link with, the quantum computing systems 103A, 103B. In some implementations, remote user devices connect with QMIs operating on the servers 108 through secure shell (SSH) or other protocols over the wide area network 115.

In some implementations, all or part of the computing system 101 operates as a hybrid computing environment. For example, quantum programs can be formatted as hybrid classical/quantum programs that include instructions for execution by one or more quantum computing resources and instructions for execution by one or more classical resources. The servers 108 can allocate quantum and classical computing resources in the hybrid computing environment, and delegate programs to the allocated computing resources for execution. The quantum computing resources in the hybrid environment may include, for example, one or more quantum processing units (QPUs), one or more quantum virtual machines (QVMs), one or more quantum simulators, or possibly other types of quantum resources. The classical computing resources in the hybrid environment may include, for example, one or more digital microprocessors, one or more specialized co-processor units (e.g., graphics processing units (GPUs), cryptographic co-processors, etc.), special purpose logic circuitry (e.g., field programmable gate arrays (FPGAs), application-specific integrated circuits (ASICs), etc.), systems-on-chips (SoCs), or other types of computing modules.

In some cases, the servers 108 can select the type of computing resource (e.g., quantum or classical) to execute an individual program, or part of a program, in the computing system 101. For example, the servers 108 may select a particular quantum processing unit (QPU) or other computing resource based on availability of the resource, speed of the resource, information or state capacity of the resource, a performance metric (e.g., process fidelity) of the resource, or based on a combination of these and other factors. In some cases, the servers 108 can perform load balancing, resource testing and calibration, and other types of operations to improve or optimize computing performance.

Each of the example quantum computing systems 103A, 103B shown in FIG. 1 can perform quantum computational tasks by executing quantum machine instructions (e.g., a binary program compiled for the quantum computing system). In some implementations, a quantum computing system can perform quantum computation by storing and manipulating information within quantum states of a composite quantum system. For example, qubits (i.e., quantum bits) can be stored in, and represented by, an effective two-level sub-manifold of a quantum coherent physical system. In some instances, quantum logic can be executed in a manner that allows large-scale entanglement within the quantum system. Control signals can manipulate the quantum states of individual qubits and the joint states of multiple qubits. In some instances, information can be read out from the composite quantum system by measuring the quantum states of the qubits. In some implementations, the quantum states of the qubits are read out by measuring the transmitted or reflected signal from auxiliary quantum devices that are coupled to individual qubits.

In some implementations, a quantum computing system can operate using gate-based models for quantum computing. For example, the qubits can be initialized in an initial state, and a quantum logic circuit comprised of a series of quantum logic gates can be applied to transform the qubits and extract measurements representing the output of the quantum computation. Individual qubits may be controlled by single-qubit quantum logic gates, and pairs of qubits may be controlled by two-qubit quantum logic gates (e.g., entangling gates that are capable of generating entanglement between the pair of qubits). In some implementations, a quantum computing system can operate using adiabatic or annealing models for quantum computing. For instance, the qubits can be initialized in an initial state, and the controlling Hamiltonian can be transformed adiabatically by adjusting control parameters to another state that can be measured to obtain an output of the quantum computation.

In some models, fault-tolerance can be achieved by applying a set of high-fidelity control and measurement operations to the qubits. For example, quantum error correcting schemes can be deployed to achieve fault-tolerant quantum computation. Other computational regimes may be used; for example, quantum computing systems may operate in non-fault-tolerant regimes. In some implementations, a quantum computing system is constructed and operated according to a scalable quantum computing architecture. For example, in some cases, the architecture can be scaled to a large number of qubits to achieve large-scale general purpose coherent quantum computing. Other architectures may be used; for example, quantum computing systems may operate in small-scale or non-scalable architectures.

The example quantum computing system 103A shown in FIG. 1 includes a quantum processing unit 102A and a control system 105A, which controls the operation of the quantum processing unit 102A. Similarly, the example quantum computing system 103B includes a quantum processing unit 102B and a control system 105B, which controls the operation of a quantum processing unit 102B. A quantum computing system may include additional or different features, and the components of a quantum computing system may operate as described with respect to FIG. 1 or in another manner.

In some instances, all or part of the quantum processing unit 102A functions as a quantum processor, a quantum memory, or another type of subsystem. In some examples, the quantum processing unit 102A includes a quantum circuit system. The quantum circuit system may include qubit devices, readout devices, and possibly other devices that are used to store and process quantum information. In some cases, the quantum processing unit 102A includes a superconducting quantum circuit, and the superconducting quantum circuit includes two qubit devices operatively coupled to each other by a coupler device. In certain examples, the two qubit devices include at least one tunable-frequency qubit device and a second qubit device. The tunable-frequency qubit device is implemented as a super-conducting quantum circuit device that includes Josephson junctions, for example, in Superconducting Quantum Interference Device (SQUID) loops or other arrangements, and are controlled by radio-frequency signals, microwave signals, and flux bias signals delivered to the quantum processing unit 102A.

In some examples, the second qubit device may be implemented as a tunable-frequency qubit device with a tunable transition frequency, or a fixed-frequency qubit device with a fixed transition frequency. In some examples, each ach of the two qubit devices can be a floating qubit device with two respective qubit electrodes electrically floating at a certain potential (without being conductively connected to a ground plane, or to a grounded electrode of a qubit device). In some instances, the coupler device can be a tunable-frequency coupler device with a tunable transition frequency or a fixed-frequency coupler device. In some examples, when the coupler device is a tunable-frequency coupler device, the effective coupling strength between the two qubit devices can be calibrated and tuned to activate or deactivate the coupling between the two qubit devices. In some instances, the tunable-frequency coupler devices have two coupler electrodes electrically floating at a certain potential, without being conductively connected to the ground plane.

In some implementations, control signals are communicated to the quantum circuit devices of the superconducting quantum circuit for performing quantum logic operations. Initial values of control parameters of the control signals can be determined based on device parameters of the quantum circuit devices, which can be obtained by performing a device calibration process or another type of process. For example, a range of operating frequencies (e.g., a tunable range of the transition frequency on which the tunable-frequency qubit device operates) and anharmonicities of the tunable-frequency qubit device, a transition frequency of the second qubit device (e.g., when the second qubit device is a fixed-frequency qubit device), a tunable range of transition frequency of the second qubit device (e.g., when the second qubit device is a tunable-frequency qubit device), a range of transition frequency of the coupler device (e.g., when the coupler device is a tunable-frequency coupler device) can be obtained and further used to determine the initial values of the control parameters of the control signals.

In some implementations, a flux modulation signal configured to modulate a transition frequency of the tunable-frequency qubit device in the quantum processing unit 102 is generated by, and communicated from, the example control system 105 to the tunable-frequency qubit device of the quantum processing unit 102 on respective signal lines. The flux modulation signal modulates the magnetic flux bias applied in the superconducting circuit loop of the tunable-frequency qubit device causing a modulation of the transition frequency of the tunable-frequency qubit device. The flux modulation signal is characterized by a flux modulation frequency and a flux modulation amplitude. A value of the flux modulation frequency can be determined such that a time average of the transition frequency of the tunable-frequency qubit device over a duration when the flux modulation signal is applied is on resonance with a transition frequency of the second qubit device of the quantum processing unit 102. In some implementations, the flux modulation frequency of the flux modulation signal applied on the tunable-frequency qubit device has a value greater than a threshold frequency value that activates interactions between the first tunable-frequency qubit device and the second qubit device. In some implementations, other control parameters for performing a two-qubit quantum logic gate can be also determined, for example, a gate time for the two-qubit quantum logic gate, parking, and gate-activating values of a coupler flux bias applied on the tunable-frequency coupler device, and other control parameters.

In some cases, an iSWAP gate applied on qubits defined by a pair of qubit devices of the quantum processing unit 102 can be calibrated by operation of the control system 105. Shifts in local phases on the qubits caused by the application of the iSWAP gate can be determined by performing a quantum process tomography of the iSWAP gate with initial values of the control parameters determined by the device parameters. In some implementations, the control system 105 includes phase tracking devices associated with the qubit devices that can be used to determine respective time-dependent components of the shifts in local phases on the respective qubits. Time-independent components are computed by subtracting the respective time-dependent components from the respective shifts in local phases. The shifts in local phases can be corrected by applying a virtual Z rotation operation before or after the iSWAP gate. The iSWAP gate with corrected shifts in local phases can be analyzed by performing a quantum process tomography. In response to the local phase errors being corrected and the iSWAP gate being determined to be repeatable, the time-independent components of the shifts in local phases can be stored for later use (e.g., stored in a memory unit of the control system 105). When the iSWAP gate is executed, for example, in a quantum program, phases of the virtual Z rotation operations, and thus, updated values of the control parameters (e.g., drive phases of qubit drive signals) are determined by the time-independent components and outputs of the phase tracking devices.

In some cases, the quantum processing unit 102A includes an ion trap system, and the qubit devices are implemented as trapped ions controlled by optical signals delivered to the quantum processing unit 102A. In some cases, the quantum processing unit 102A includes a spin system, and the qubit devices are implemented as nuclear or electron spins controlled by microwave or radio-frequency signals delivered to the quantum processing unit 102A. The quantum processing unit 102A may be implemented based on another physical modality of quantum computing.

The quantum processing unit 102A may include, or may be deployed within, a controlled environment. The controlled environment can be provided, for example, by shielding equipment, cryogenic equipment, and other types of environmental control systems. In some examples, the components in the quantum processing unit 102A operate in a cryogenic temperature regime and are subject to very low electromagnetic and thermal noise. For example, magnetic shielding can be used to shield the system components from stray magnetic fields, optical shielding can be used to shield the system components from optical noise, thermal shielding and cryogenic equipment can be used to maintain the system components at controlled temperature, etc.

In some implementations, the example quantum processing unit 102A can process quantum information by applying control signals to the qubits in the quantum processing unit 102A. The control signals can be configured to encode information in the qubits, to process the information by performing quantum logic gates or other types of operations, or to extract information from the qubits. In some examples, the operations can be expressed as single-qubit quantum logic gates, two-qubit quantum logic gates (e.g., an iSWAP, inverse of iSWAP, or another iSWAP-like gate), or other types of quantum logic gates that operate on one or more qubits. A quantum logic circuit, which includes a sequence of quantum logic operations, can be applied to the qubits to perform a quantum algorithm. The quantum algorithm may correspond to a computational task, a hardware test, a quantum error correction procedure, a quantum state distillation procedure, or a combination of these and other types of operations.

The example control system 105A includes controllers 106A and signal hardware 104A. Similarly, control system 105B includes controllers 106B and signal hardware 104B. All or part of the control systems 105A, 105B can operate in a room-temperature environment or another type of environment, which may be located near the respective quantum processing units 102A, 102B. In some cases, the control systems 105A, 105B include classical computers, signaling equipment (microwave, radio, optical, bias, etc.), electronic systems, vacuum control systems, refrigerant control systems, or other types of control systems that support operation of the quantum processing units 102A, 102B.

The control systems 105A, 105B may be implemented as distinct systems that operate independent of each other. In some cases, the control systems 105A, 105B may include one or more shared elements; for example, the control systems 105A, 105B may operate as a single control system that operates both quantum processing units 102A, 102B. Moreover, a single quantum computer system may include multiple quantum processing units, which may operate in the same controlled (e.g., cryogenic) environment or in separate environments.

The example signal hardware 104A includes components that communicate with the quantum processing unit 102A. The signal hardware 104A may include, for example, waveform generators, amplifiers, digitizers, high-frequency sources, DC sources, AC sources, etc. The signal hardware may include additional or different features and components. In the example shown, components of the signal hardware 104A are adapted to interact with the quantum processing unit 102A. For example, the signal hardware 104A can be configured to operate in a particular frequency range, configured to generate and process signals in a particular format, or the hardware may be adapted in another manner.

In some instances, one or more components of the signal hardware 104A generate control signals, for example, based on control information from the controllers 106A. The control signals can be delivered to the quantum processing unit 102A during operation of the quantum computing system 103A. For instance, the signal hardware 104A may generate signals to implement quantum logic operations, readout operations, or other types of operations. As an example, the signal hardware 104A may include arbitrary waveform generators (AWGs) that generate electromagnetic waveforms (e.g., microwave or radio-frequency) or laser systems that generate optical waveforms. The waveforms or other types of signals generated by the signal hardware 104A can be delivered to devices in the quantum processing unit 102A to operate qubit devices, readout devices, bias devices, coupler devices, or other types of components in the quantum processing unit 102A.

In some instances, the signal hardware 104A receives and processes signals from the quantum processing unit 102A. The received signals can be generated by the execution of a quantum program on the quantum computing system 103A. For instance, the signal hardware 104A may receive signals from the devices in the quantum processing unit 102A in response to readout or other operations performed by the quantum processing unit 102A. Signals received from the quantum processing unit 102A can be mixed, digitized, filtered, or otherwise processed by the signal hardware 104A to extract information, and the information extracted can be provided to the controllers 106A or handled in another manner. In some examples, the signal hardware 104A may include a digitizer that digitizes electromagnetic waveforms (e.g., microwave or radio-frequency) or optical signals, and a digitized waveform can be delivered to the controllers 106A or to other signal hardware components. In some instances, the controllers 106A process the information from the signal hardware 104A and provide feedback to the signal hardware 104A; based on the feedback, the signal hardware 104A can in turn generate new control signals that are delivered to the quantum processing unit 102A.

In some implementations, the signal hardware 104A includes signal delivery hardware that interfaces with the quantum processing unit 102A. For example, the signal hardware 104A may include filters, attenuators, directional couplers, multiplexers, diplexers, bias components, signal channels, isolators, amplifiers, power dividers, and other types of components. In some instances, the signal delivery hardware performs preprocessing, signal conditioning, or other operations to the control signals to be delivered to the quantum processing unit 102A. In some instances, signal delivery hardware performs preprocessing, signal conditioning, or other operations on readout signals received from the quantum processing unit 102A.

The example controllers 106A communicate with the signal hardware 104A to control operation of the quantum computing system 103A. The controllers 106A may include classical computing hardware that directly interfaces with components of the signal hardware 104A. The example controllers 106A may include classical processors, memory, clocks, digital circuitry, analog circuitry, and other types of systems or subsystems. The classical processors may include one or more single- or multi-core microprocessors, digital electronic controllers, special purpose logic circuitry, e.g., an FPGA (field programmable gate array) or an ASIC (application specific integrated circuit), or other types of data processing apparatus. The memory may include any type of volatile or non-volatile memory or another type of computer storage medium. The controllers 106A may also include one or more communication interfaces that allow the controllers 106A to communicate via the local network 109 and possibly other channels. The controllers 106A may include additional or different features and components.

In some implementations, the controllers 106A include memory or other components that store quantum state information, for example, based on qubit readout operations performed by the quantum computing system 103A. For instance, the states of one or more qubits in the quantum processing unit 102A can be measured by qubit readout operations, and the measured state information can be stored in a cache or other type of memory system in or more of the controllers 106A. In some cases, the measured state information is subsequently used in the execution of a quantum program, a quantum error correction procedure, a QPU calibration or testing procedure, or another type of quantum process.

In some implementations, the controllers 106A include memory or other components that store a quantum program containing quantum machine instructions for execution by the quantum computing system 103A. In some instances, the controllers 106A can interpret the quantum machine instructions and perform hardware-specific control operations according to the quantum machine instructions. For example, the controllers 106A may cause the signal hardware 104A to generate control signals that are delivered to the quantum processing unit 102A to execute the quantum machine instructions.

In some instances, the controllers 106A extract qubit state information from qubit readout signals, for example, to identify the quantum states of qubits in the quantum processing unit 102A or for other purposes. For example, the controllers may receive the qubit readout signals (e.g., in the form of analog waveforms) from the signal hardware 104A, digitize the qubit readout signals, and extract qubit state information from the digitized signals. In some cases, the controllers 106A compute measurement statistics based on qubit state information from multiple shots of a quantum program. For example, each shot may produce a bitstring representing qubit state measurements for a single execution of the quantum program, and a collection of bitstrings from multiple shots may be analyzed to compute quantum state probabilities.

In some implementations, the controllers 106A include one or more clocks that control the timing of operations. For example, operations performed by the controllers 106A may be scheduled for execution over a series of clock cycles, and clock signals from one or more clocks can be used to control the relative timing of each operation or groups of operations. In some implementations, the controllers 106A may include classical computer resources that perform some or all of the operations of the servers 108 described above. For example, the controllers 106A may operate a compiler to generate binary programs (e.g., full or partial binary programs) from source code; the controllers 106A may include an optimizer that performs classical computational tasks of a hybrid classical/quantum program; the controllers 106A may update binary programs (e.g., at runtime) to include new parameters based on an output of the optimizer, etc.

The other quantum computer system 103B and its components (e.g., the quantum processing unit 102B, the signal hardware 104B, and controllers 106B) can be implemented as described above with respect to the quantum computer system 103A; in some cases, the quantum computer system 103B and its components may be implemented or may operate in another manner.

In some implementations, the quantum computer systems 103A, 103B are disparate systems that provide distinct modalities of quantum computation. For example, the computer system 101 may include both an adiabatic quantum computer system and a gate-based quantum computer system. As another example, the computer system 101 may include a superconducting circuit-based quantum computer system and an ion trap-based quantum computer system. In such cases, the computer system 101 may utilize each quantum computing system according to the type of quantum program that is being executed, according to availability or capacity, or based on other considerations.

Figure 2:
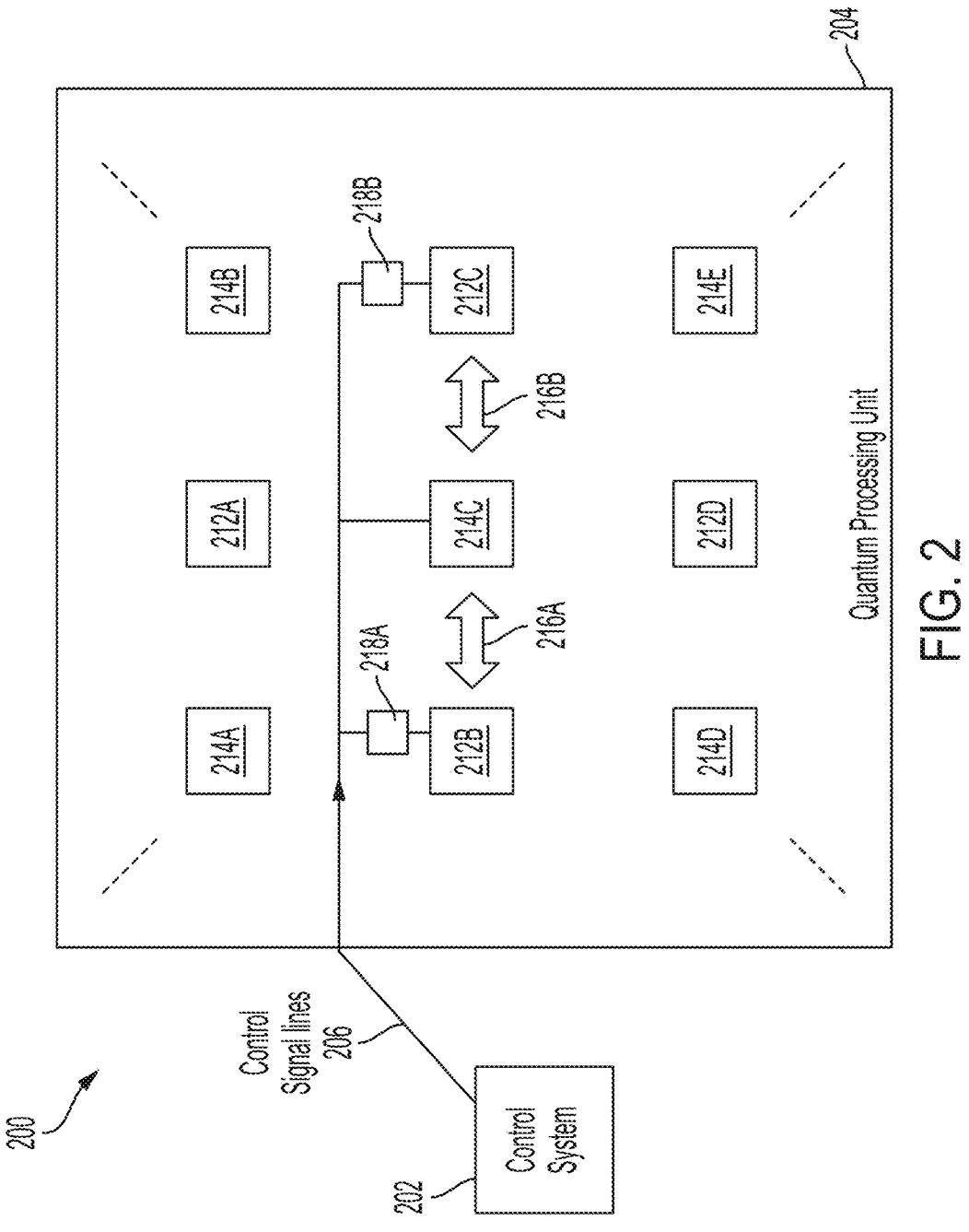
FIG. 2 is a block diagram showing devices and interactions in an example quantum computing system.

FIG. 2 is a block diagram showing devices and interactions in an example quantum computing system 200. The example quantum computing system 200 includes a control system 202 and a superconducting quantum processing unit 204. The example superconducting quantum processing unit 204 includes a device array, which includes quantum circuit devices arranged in a two-dimensional or three-dimensional lattice structure. Nine of the quantum circuit devices in the device array are shown in FIG. 2. In particular, FIG. 2 shows four qubit devices 212, e.g., 212A, 212B, 212C, 212D and five coupler devices 214, e.g., 214A, 214B, 214C, 214D, 214E. The quantum computing system 200 may include additional or different features, and the components may be arranged in another manner.

In the example shown in FIG. 2, the quantum circuit devices are arranged in a rectilinear (e.g., rectangular or square) array that extends in two spatial dimensions (e.g., in the plane of the page). In some implementations, the devices can be deployed in another type of spatial arrangement (e.g., another type of ordered array). In some instances, the rectilinear array also extends in a third spatial dimension (e.g., in/out of the page), for example, to form a cubic array or another type of three-dimensional array. The superconducting quantum processing unit 204 may include additional devices, including additional qubit devices, coupler devices, readout resonator devices, or other quantum circuit devices.

In some implementations, the control system 202 interfaces with the superconducting quantum processing unit 204 through a signal delivery system that includes connector hardware elements. For example, the connector hardware elements of the control system 202 can include control signal lines 206, signal processing hardware, filters, feedthrough devices (e.g., light-tight feedthroughs, etc.), and other types of components. In some implementations, the control system connector hardware can span multiple different temperature and noise regimes. For example, the connector hardware elements can include a series of temperature stages operating at different temperatures, e.g., 60 Kelvin (K), 3 K, 800 milli Kelvin (mK), 150 mK, that decrease between a higher temperature regime of the example control system 202 and a lower temperature regime of the example superconducting quantum processing unit 204.

In some implementations, the qubit devices 212 are housed between neighboring pairs of the coupler devices 214 in a device array within the superconducting quantum processing unit 204. Quantum states (e.g., qubits) of respective qubit devices 212 can be manipulated by control signals, or read by readout signals, generated by the control system 202. The qubit devices 212 can be controlled individually, for example, by delivering control signals to the respective qubit devices 212. In some cases, a set of neighboring quantum circuit devices (e.g., the qubit devices 212B, 212C and the coupler device 214C) is controlled jointly by delivering control signals to the set. In some cases, readout devices can detect the quantum states of the qubit devices 212, for example, by interacting directly with the respective qubit devices 212.

In the example shown in FIG. 2, the energy difference E between any two adjacent energy levels in a qubit device 212 can be represented as a transition frequency ω of the qubit device (e.g., according to ω=E/ℏ). In some examples, a transition frequency of a qubit device 212 is tunable (e.g., a tunable-frequency qubit device), for example, by application of an offset field. In some instances, a superconducting tunable-frequency qubit device may include a tunable transmon qubit device, a flux qubit device, a capacitively shunted flux qubit device, a flatsonium qubit device, a fluxonium qubit device, or another type of tunable-frequency qubit device. In some implementations, a tunable-frequency qubit device includes a superconducting circuit loop (e.g., a SQUID loop), which can receive a magnetic flux that tunes the transition frequency of the tunable-frequency qubit device. As an example, the superconducting circuit loop may include two Josephson junctions connected in parallel, and the tunable-frequency qubit device may also include a shunt capacitor in parallel with the two Josephson junctions. For another example, the superconducting circuit loop may include three Josephson junctions, a single Josephson junction, and a linear indicator in parallel, or another loop. In some implementations, the transition frequency of the tunable-frequency qubit device may be defined at least in part by Josephson energies of the two Josephson junctions, a capacitance of the shunt capacitor, and a magnetic flux threading the superconducting circuit loop. In some implementations, the qubit devices 212 may be implemented as the first/second qubit devices 312/314 shown in FIG. 3, the first/second qubit devices 1102/1104 shown in FIG. 11, or in another manner.

In some examples, the transition frequency of a qubit device 212 is not tunable by application of an offset field and is independent of magnetic flux experienced by the qubit device 212. For instance, a fixed-frequency qubit device may have a fixed transition frequency that is defined by an electronic circuit of the qubit device. As an example, a fixed-frequency qubit device (e.g., a fixed-frequency transmon qubit device) may be implemented without a SQUID loop. In some examples, the fixed-frequency qubit device includes one Josephson junction and a shunt capacitor, and the transition frequency of the fixed-frequency qubit device is defined at least in part by a Josephson energy of the Josephson junction and a capacitance of the shunt capacitor, which is independent of a magnetic flux experienced by the fixed-frequency qubit device. In some implementations, the qubit devices 212 may be implemented as the fixed-frequency qubit device 314, 1104 in FIGS. 3 and 11, or in another manner.

In certain instances, the qubit device 212 includes a qubit electrode. In this case, the qubit device 212 is considered a "grounded" qubit device when the one or more Josephson junctions of the qubit device 212 are connected between the qubit electrode and a ground plane (e.g., two or more Josephson junctions may be connected in parallel between the qubit electrode and a ground plane); and the shunt capacitor is defined by capacitance between the qubit electrode and the ground plane. In other instances, the qubit device 212 includes two qubit electrodes. In this case, the qubit device 212 is considered a "floating" qubit device when the one or more Josephson junctions of the qubit device 212 are connected between the two qubit electrodes that are not directly connected to ground (e.g., two or more Josephson junctions may be connected in parallel between the two qubit electrodes); and the shunt capacitor is defined by capacitance between the two qubit electrodes. In some instances, when the coupler device includes two coupler electrodes, the two coupler electrodes are electrically floating at a certain potential without being conductively connected to a ground plane. In other words, neither of the two coupler electrodes is conductively coupled to ground. In this case, the two coupler electrodes of the coupler device can be capacitively coupled to the ground plane, e.g., through a residual capacitance between each of the two coupler electrodes and the ground.

The coupler devices 214A, 214B, 214C, 214D, 214E may be implemented by transmon qubit devices, flux qubit devices, flatsonium qubit devices, fluxonium qubit devices, or other types of tunable-frequency qubit devices. In some implementations, the coupler device 214 is a tunable-frequency coupler device. In certain examples, a tunable-frequency coupler device may include a superconducting circuit loop (e.g., a SQUID loop), which can receive a coupler flux bias that tunes the transition frequency of the tunable-frequency coupler device. In some instances, a tunable-frequency coupler device includes two coupler electrodes; the two Josephson junctions of the tunable-frequency coupler device are connected in parallel between the two coupler electrodes; the shunt capacitor is caused by the two coupler electrodes. In this case, the tunable-frequency coupler device is a tunable-frequency "floating" coupler device. In some instances, the coupler devices 214 may be implemented as the tunable "grounded" coupler device. In some implementations, the coupler devices 214 may be implemented as the fixed-frequency coupler device 352 shown in FIG. 3, or in another manner.

In certain examples, an offset field can be, for example, a magnetic flux bias, a DC electrical voltage, or another type of field. In some implementations, the tunability of the qubit devices 212A, 212B, 212C, 212D, in the superconducting quantum processing unit 204 allows pairs of qubit devices to be selectively coupled on-demand to perform multi-qubit quantum logic gates, to entangle pairs of qubits defined by pairs of qubit devices 212, or to perform other types of control operations. The qubit devices can have a high "on/off" ratio, which refers to the ratio of the effective coupling strength provided by control of the tunable-frequency coupler device. In some implementations, the coupler devices 214A, 214B, 214C, 214D, 214E, when activated or deactivated, can enable or disable coupling between two neighboring qubit devices 212, respectively. In some implementations, the coupler devices 214 may be implemented as the tunable-frequency coupler device 1106 shown in FIG. 11, or in another manner.

In some instances, information is encoded in the qubit devices in the superconducting quantum processing unit 204, and the information can be processed by operation of the qubit devices 212A, 212B, 212C, 212D. For instance, input information can be encoded in the computational states or computational subspaces defined by some or all of the qubit devices 212 in the superconducting quantum processing unit 204. The information can be processed, for example, by applying a quantum algorithm or other operations to the input information. The quantum algorithm may be decomposed as quantum logic gates or instruction sets that are performed by the qubit devices 212 and coupler devices 214 over a series of clock cycles. For instance, a quantum algorithm may be executed by a combination of single-qubit quantum logic gates and two-qubit quantum logic gates. In some cases, information is processed in another manner. Processing the information encoded in the qubit devices 212 can produce output information that can be extracted from the qubit devices 212. The output information can be extracted, for example, by performing state tomography or individual readout operations. In some instances, the output information is extracted over multiple clock cycles or in parallel with the processing operations.

In some aspects of operation, the control system 202 communicates control signals to the qubit devices 212 in the superconducting quantum processing unit 204. The control signals can be configured to modulate, increase, decrease, or otherwise manipulate the transition frequencies of the qubit devices 212A, 212B, 212C, 212D (e.g., when the qubit devices are tunable-frequency qubit devices). In some implementations, a control signal on a control signal line 206 includes a flux bias signal that varies a magnetic flux experienced by the tunable-frequency qubit device, and varying the magnetic flux can change the transition frequency of the tunable-frequency qubit device. A control signal on a control signal line 206 includes a flux modulation signal that is configured to modulate a transition frequency of a tunable-frequency qubit device at a certain flux modulation frequency and a certain flux modulation amplitude. A control signal on a control signal line 206 includes a qubit drive signal that is configured to drive the qubit at the transition frequency in order to apply a two-qubit quantum logic gate. A control signal on a control signal line 206 can be a direct current (DC) signal communicated from the control system 202 to the individual qubit device 212. In some implementations, a control signal can be an alternating current (AC) signal communicated from the control system 202 to the individual qubit device 212. In some cases, the AC signal may be superposed with a direct current (DC) signal. Other types of control signals may be used.

In the example shown in FIG. 2, when the coupler device 214C is a tunable-frequency coupler device, the control system 202 communicates control signals on control signal lines 206 to the coupler device 214C to generate interactions between the coupler device 214C and the neighboring qubit devices 212B, 212C. For instance, the control signals on the control signal lines 206 can generate a first interaction 216A between the qubit device 212B and the coupler device 214C, a second interaction 216B between the qubit device 212C and the coupler device 214C, or a combination of them in series or in parallel. In some cases, the control signals can generate an interaction that is mediated by the coupler device 214C. For instance, the control signals may generate an interaction between a pair of the tunable devices 212B, 212C in which the coupler device 214C mediates the interaction generated by the control signals (e.g., as in the examples described below).

In some implementations, the control signals are configured to generate interactions that apply quantum logic gates on the qubits defined by the qubit devices. For example, in some cases, one or more of the control signals generate an interaction that applies a two-qubit quantum logic gate to a pair of qubits defined by two of the qubit devices 212 coupled through a coupler device 214 in the superconducting quantum processing unit 204. A control signal on a control signal line 206 may be a current signal, a voltage signal, or another type of electrical signal which can be used to control a circuit element associated with a control signal line 206. For example, when a qubit device 212C is a tunable-frequency qubit device, the control signal line 206 may include a flux bias element that is inductively coupled to a superconducting circuit loop of the qubit device 212C to control the magnetic flux through the superconducting circuit loop in the qubit device 212C. The control signal may cause the flux bias element to modulate the magnetic flux at a flux modulation frequency. In some instances, the control signal line 206 and the superconducting circuit loop are implemented as the control signal line 318 and the superconducting circuit loop 324 shown in FIG. 3.

In some instances, the control system 202 identifies a quantum logic gate to be applied to a pair of qubits defined by a pair of qubit devices 212 in the superconducting quantum processing unit 204. The pair of qubits includes, for example, a first qubit defined by the qubit device 212B and a second qubit defined by the qubit device 212C in the qubit device array through the coupler device 214C. The control signal can be configured to turn on the coupler device 214C (e.g., when the coupler device 214C is a tunable-frequency coupler device) to enable the coupling between the qubit devices 212B and 212C. The control signal can be further configured to perform a control operation (e.g., a two-qubit quantum logic gate) on the qubit devices 212B, 212C. In some implementations, the control signal can be further configured to perform a calibration process to determine values of device parameters and initial values of control parameters for activating the quantum logic gate; for enabling and disabling the coupling between the two qubit devices 212, and for other control operations.

The control parameters of the control signals on control signal lines 206 can be selected to achieve a specified multi-qubit quantum logic gate. In some systems, applying the two-qubit quantum logic gate to the pair of qubits defined by a pair of qubit devices may include applying any quantum logic gate from the XY family of gates, the controlled-phase family of gates, the iSWAP family of gates, or another family of gates. In some cases, applying the two-qubit quantum logic gate to the pair of qubits includes applying a controlled-phase gate (e.g., a controlled-Z gate) to the pair of qubits. In some cases, applying the two-qubit quantum logic gate to the pair of qubits includes applying a Bell-Rabi gate, a square-root-of-Bell-Rabi gate, or another two-photon gate to the pair of qubits.

In some implementations, the control system 202, or another type of system associated with the quantum computing system 200, determines values of the control parameters of control signals for implementing two-qubit quantum logic gates in the superconducting quantum processing unit 204. For example, the values of the control parameters for the control signal may be determined by a gate calibration process defined in software, firmware, or hardware or a combination thereof. In some cases, the control system 202 executes a gate calibration process (e.g., the example process 600 in FIG. 6) when the superconducting quantum processing unit 204 is first installed for use in the quantum computing system 200, and the gate calibration process may be repeated at other times (e.g., as needed, periodically, according to a calibration schedule, etc.). For instance, a gate calibration module may execute a calibration process that obtains values of device parameters of the qubit devices 212 and the coupler devices 214 in the superconducting quantum processing unit 204. For example, the device parameters include a range of qubit operating frequency and anharmonicity of the qubit devices 212 (e.g., when the qubit devices 212 are tunable-frequency qubit devices), an operating frequency and anharmonicity of the qubit devices 212 (e.g., when the qubit devices 212 are fixed-frequency qubit devices), and a coupling between the qubit devices and the tunable-frequency coupler devices, or another parameter.

In some instances, the values of the device parameters are used to determine initial values of the control parameters of control signals used to execute quantum logic gates. In some implementations, the control parameters for the control signal may include the relative duration, drive phase, flux modulation frequency, flux modulation amplitude, or another parameter. When the qubit devices 212B, 212C are tunable-frequency qubit devices, the control signal with the determined parameters can be applied to one or more of the qubit devices 212B, 212C to bring the qubit devices 212B, 212C on resonance with each other. The control signal can vary values of the magnetic flux applied to the coupler device 214C (e.g., when the coupler device 214C is a tunable-frequency coupler device) to determine a parking value which causes a total coupling strength of the qubit devices 212B, 212C to vanish or to be less than or equal to a predetermined threshold value. The control signal can vary values of the magnetic flux applied to the coupler device 214C to determine a gate-activating value which corresponds to a maximal value of the total coupling strength. For example, the control parameters of the control signals for executing a two-qubit quantum logic gate (e.g., bringing the two qubit devices 212B, 212C on resonance) can be identified with respect to the example process 600 shown in FIG. 6, or in another manner. For another example, after the values of the control parameters of the control signals applied to the qubit devices are identified, the values of the control parameters of control signals applied on the coupler device 214C to minimize and maximize the coupling strength can be also identified to disable and enable the coupling between the two qubit devices 212B, 212C.

In some cases, the parking value of the coupler flux bias is determined based on a threshold value of the coupling strength between the qubit devices. The threshold value can be determined based on target operating parameters of the superconducting quantum processing unit or target operating parameters for processes (e.g., quantum logic gates or other operations) to be performed by the superconducting quantum processing unit 204. In some cases, the threshold value represents a maximum value of the coupling strength that is small enough to allow single-qubit gates (or other types of quantum logic gates) to be performed at or above a target gate fidelity. In some cases, zero coupling strength is ideal; a non-zero value of the coupling strength can be effectively equal to zero when it is small enough to still allow single-qubit gates to be performed at or above the target gate fidelity. In such cases, target control parameters may be achieved by using a parking value that minimizes the magnitude of the coupling strength or otherwise causes the magnitude of the coupling strength to be less than the threshold value (effectively equal to zero). Thus, a threshold value of the coupling strength can define a maximum value of the coupling strength that still preserves single-qubit gate fidelities above a target gate fidelity. Other types of gate fidelities and/or other criteria may be used to define a threshold value of the coupling strength.

To perform a device calibration process, the control system 202 obtains calibration measurements from the superconducting quantum processing unit, and the control system 202 uses the calibration measurements to determine the control parameters of the control signals. For instance, in the quantum computing system 103A shown in FIG. 1, the controllers 106A can execute a pre-defined device calibration routine, and calibration signals can then be generated by the signal hardware 104A and delivered to quantum circuit devices (e.g., qubit devices, coupler devices, and readout resonator devices) in the quantum processing unit 102A. The pre-defined calibration routine can include, for example, the types of experiments, measurements, processes, optimization criteria, or other features described in U.S. Pat. No. 10,282,675 entitled "Performing a Calibration Process in a Quantum Computing System;" other types of calibration routines may be used in some cases. During the device calibration process, the control system 202 obtains calibration measurements from the quantum processing unit 204 and uses the calibration measurements in the calibration routine, for instance, to identify an improved or optimal value of one or more control parameters. The calibration measurements may include readout signals from readout resonator devices or other types of measurements obtained from the quantum processing unit 204. The control parameters that are modified or updated based on the calibration measurements can include, for example, the amplitude (power), frequency, duration, or phase of a qubit drive signal; the amplitude (power), frequency, duration, or phase of a flux bias signal; or other types of control parameters for control signals.

Figure 6:
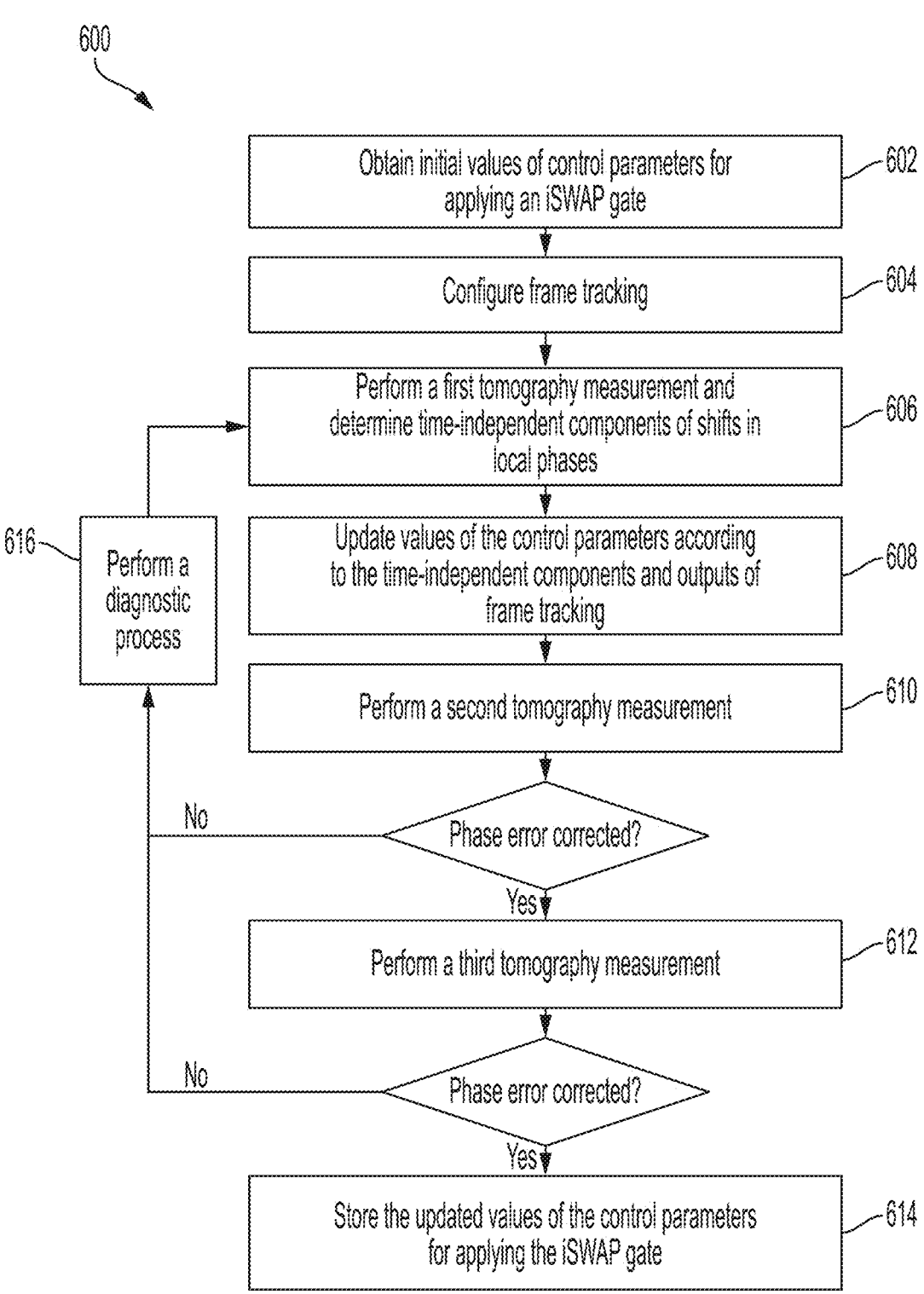
FIG. 6 is a flow chart of an example process for iSWAP gate calibration.

In some implementations, the control system 202 includes hardware and computer programs that are configured to perform quantum process tomography and frame tracking to determine shifts in local phases caused by an execution of an iSWAP gate, e.g., the operations of the example process 600 in FIG. 6. In some implementations, the control system 202 includes phase tracking devices 218A, 218B associated with respective qubit drive lines (e.g., the control signal lines 206) of respective qubit devices 212B, 212C to track time-dependent components of the shifts in local phases. In some instances, a phase tracking device 218A, 218B may be a numerically controlled oscillator (NCO) or another type of phase tracking device. In some instances, a phase tracking device determines time and thus, the time-dependent components of the shifts in local phases, according to the transition frequencies of the qubit devices. In some implementations, outputs from the phase tracking devices represents local phases accumulated by the respective qubits during application of the iSWAP gate. The output of a phase tracking device includes time, phase (which can be computed based on time and frequency), etc. The transition frequencies of the qubit devices can be determined according to device parameters or based on a device calibration process. In some implementations, the control system 202 includes instruments and devices for performing a quantum process tomography. In some implementations, the values of the shifts in local phases are determined by the control system 202 and used to update drive phases of qubit drive signals transmitted on qubit drive lines to perform virtual Z rotation operations in order to correct the local phase errors.

Figure 3:
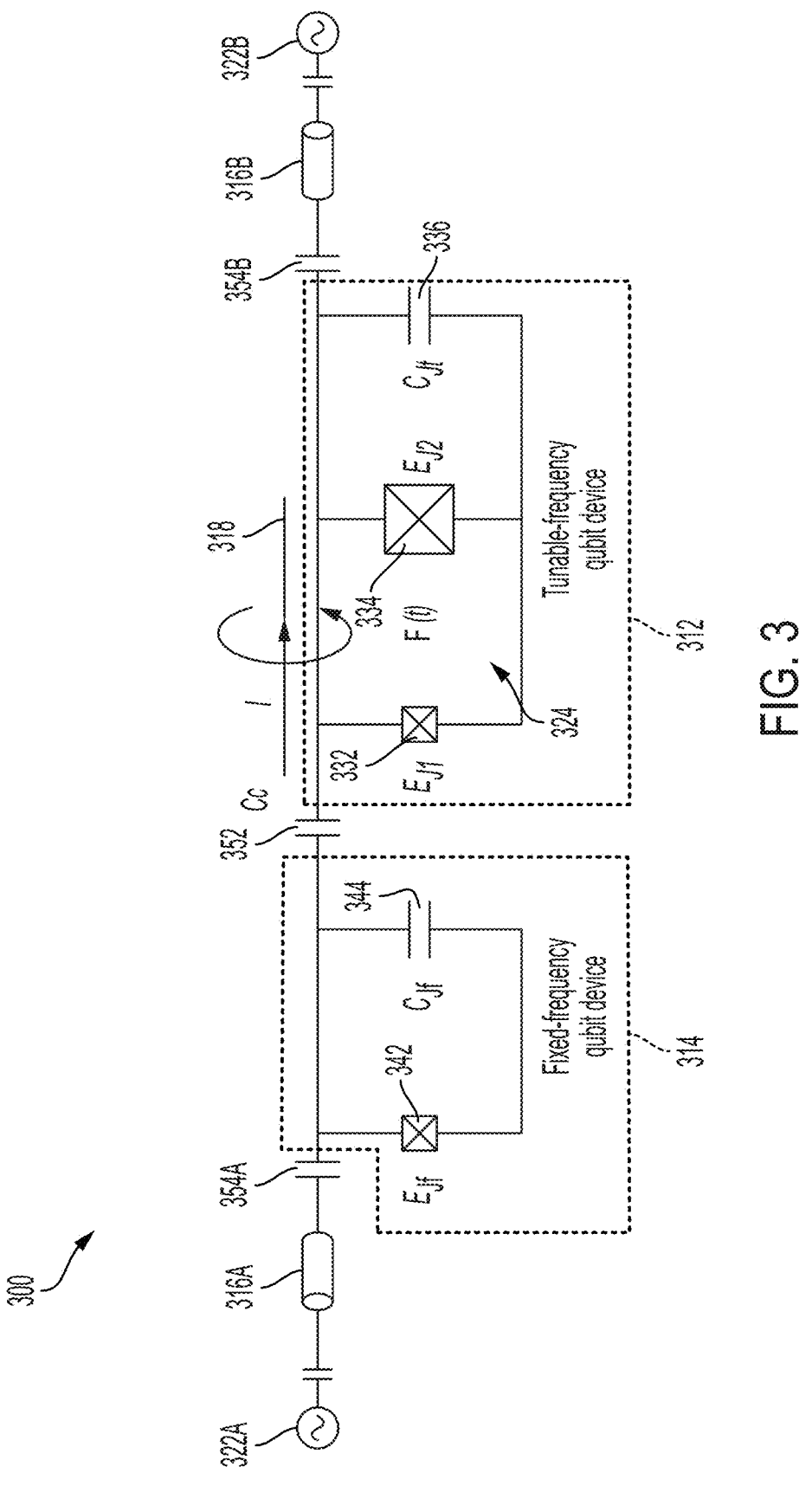
FIG. 3 is a circuit diagram showing an equivalent circuit of an example superconducting circuit.

FIG. 3 is a circuit diagram showing an equivalent circuit 300 of an example superconducting circuit. The equivalent circuit 300 represented in FIG. 3 includes a tunable-frequency qubit device 312, a fixed-frequency qubit device 314, and a control signal line 318. The example equivalent circuit 300 further includes a source 322A and readout resonator device 316A coupled to the fixed-frequency qubit device 314 via a capacitor 354A. The example equivalent circuit 300 also includes a source 322B and a readout resonator device 316B coupled to the tunable-frequency qubit device 312 via a capacitor 354B. In some examples, the tunable-frequency qubit device 312 and the fixed-frequency qubit device 314 may be implemented by other types of systems, and the features and components represented in FIG. 3 can be extended in a larger two-dimensional or three-dimensional array of devices. For instance, the equivalent circuit 300 in FIG. 3 can represent any of the qubit devices 212 and one of its coupler devices 214 in the superconducting quantum processing unit 204 in FIG. 2, or the equivalent circuit 300 in FIG. 3 can represent devices in another type of system or environment. The quantum computing system may include additional or different features, and the components may be arranged as shown or in another manner.

In the example shown in FIG. 3, the tunable-frequency qubit device 312 is implemented as a tunable-frequency transmon qubit device. As shown, the tunable-frequency qubit device 312 includes two Josephson junctions, e.g., a first Josephson junction 332 and a second Josephson junction 334. The first and second Josephson junctions 332, 334 having Josephson energies $E_{J1}$ and $E_{J2}$ are connected in parallel with each other to form a superconducting circuit loop 324, which resides adjacent to the control signal line 318. The tunable-frequency qubit device 312 also includes a capacitor 336 with a shunt capacitance $C_{Jt}$, which is connected in parallel with the two Josephson junctions 332, 334. In some implementations, the control signal line 318 is a flux bias control line. In some instances, a flux bias control line is coupled to a flux bias element (e.g., a conductor, an inductor, or another type of circuit component configured to carry a current I), which is coupled to the superconducting circuit loop 324 by a mutual inductance and generates a magnetic flux $\Phi(t)$ through the superconducting circuit loop 324 in the tunable-frequency qubit device 312. In some implementations, the magnetic flux $\Phi(t)$ controls the transition frequency of the tunable-frequency qubit device 312. Manipulating the magnetic flux $\Phi(t)$ through the superconducting circuit loop 324 can increase or decrease the transition frequency of the tunable-frequency floating qubit device 312. In this example, the magnetic flux $\Phi(t)$ through the superconducting circuit loop 324 is an offset field that can be modified in order to tune the transition frequency of the tunable-frequency qubit device 312. In some implementations, the magnetic flux $\Phi(t)$ can be modulated by communicating a flux modulation signal on the flux bias control line which causes a modulation to the transition frequency of the tunable-frequency qubit device 312.

In the example shown in FIG. 3, the fixed-frequency qubit device 314 is implemented as a fixed-frequency transmon qubit device. As shown, the fixed-frequency qubit 314 includes a Josephson junction 342 having Josephson energy $E_{Jf}$ and a capacitor 344 with a shunt capacitance $C_{Jf}$, which are connected in parallel. The fixed-frequency qubit device 314 is capacitively coupled to the tunable-frequency qubit device 312 through a fixed-frequency coupler device 352, e.g., a capacitive coupler device with a capacitance $C_c$. In some instances, a parameter g can represent a capacitive coupling strength between the fixed-frequency qubit device 314 and the tunable-frequency qubit device 312.

In some implementations, the fixed-frequency qubit device 314 has a transition frequency $\omega_{F_{01}}$ with a fixed value, while the tunable-frequency qubit device 312 has a transition frequency $\omega_{T_{01}}(t)$ that can be tuned over time. In this example, the tunability of the transition frequency of a tunable-frequency qubit device can be used to perform two-qubit quantum logic gates on the two qubit devices 312, 314. For instance, by modulating the transition frequency $\omega_{T_{01}}(t)$ of the tunable-frequency qubit device at predetermined values of the flux modulation frequency and flux modulation amplitude, a two-qubit quantum logic gate can be activated between the two qubit devices 312, 314.

As shown in FIG. 3, the control signal line 318 can receive control signals, for example, from an external control system (e.g., the control system 202 of the quantum computing system 200 in FIG. 2). In some instances, the control signal line 318 can include, for example, a flux bias element that is configured to apply an offset field to the tunable-frequency qubit device 312. For instance, the flux bias element may include an inductor (e.g., a partial loop, a single loop, or multiple loops of a conductor) that has a mutual inductance with the circuit loop 324. In the example shown, the transition frequency $\omega_{T_{01}}(t)$ of the tunable-frequency qubit device 312 is controlled by the magnetic flux $\Phi(t)$ by controlling the current I through the control signal line 318. In some instances, the transition frequency $\omega_{T_{01}}(t)$ may be controlled in another manner, for instance, by another type of control signal. In some implementations, the control signal line 318 may include an inductance loop or another type of flux bias element that is coupled (e.g., conductively, capacitively, or inductively) to a control port to receive control signals, and to the tunable-frequency qubit device 312. In certain instances, the control signals on the control signal line 318 may cause the flux bias element to generate and modulate the magnetic flux in the superconducting circuit loop 324. In some implementations, the control signals on the control signal line 318 are implemented as the control signals communicated on the control signal lines 206 as shown in FIG. 2.

In some instances, the fixed-frequency qubit device 314 and the tunable-frequency qubit device 312 can also be coupled together through a tunable-frequency coupler device. The tunable-frequency coupler device may include one or more tunable-frequency transmon qubit devices, tunable-frequency fluxonium qubit devices, or another type of tunable-frequency qubit device. The tunable-frequency coupler device may be capacitively coupled to each of the fixed-frequency qubit device 314 and the tunable-frequency qubit device 312 with respective coupling strengths. In some instances, an effective coupling between the fixed-frequency qubit device 314 and the tunable-frequency qubit device 312 is determined by the capacitance value of the capacitor 352. For example, a separate control signal (e.g., a coupler flux bias control signal) can be communicated on a control signal line to tune the coupler flux bias threading to the tunable-frequency coupler device, for example with a superconducting circuit loop, to turn on the coupling. When the tunable-frequency coupler device is turned on, the flux modulation signal can be communicated to the flux bias element so as to apply modulate the coupler flux bias to the tunable-frequency qubit device 312 to execute a two-qubit quantum logic gate.

Figure 5A:
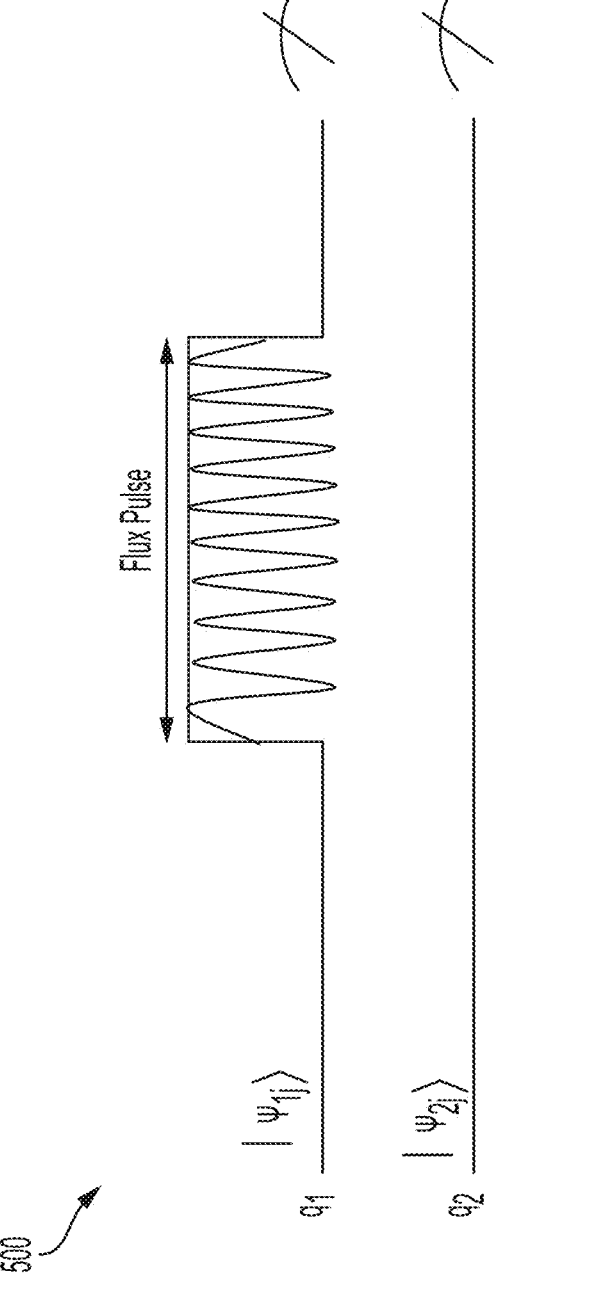
FIGS. 5A-5B are example pulse sequences for iSWAP gate calibration and estimation of the local phases to achieve a repeatable iSWAP.

As shown in FIG. 3, a two-qubit quantum logic gate (e.g., an iSWAP gate) can be executed on the fixed-frequency qubit device 314 and the tunable-frequency qubit device 312 by either tuning the transition frequency of the tunable-frequency qubit device 312 in and out of resonance with the fixed-frequency qubit device 314 (e.g., using the iSWAP flux pulse shown in FIG. 5B), or by modulating the frequency of one of the qubits at the frequency difference between the transition frequencies of the two qubit devices (e.g., using the iSWAP flux pulse shown in FIG. 5A). In some instances, an iSWAP gate where the two qubit devices 312, 314 are brought in resonance by modulating the transition frequency of the tunable-frequency qubit device 312 can be described by the Hamiltonian given below, $$H = g\left(e^{-i\Delta t}|10\rangle\langle 01| + e^{i\Delta t}|01\rangle\langle 10|\right) \tag{1}$$

Where g is the capacitive coupling strength, e.g., $$g = g_0 J_0\left(\frac{\tilde{\omega}_2}{2\omega_p}\right),$$

$g_0$ is the bare qubit-qubit coupling, $J_0$ is the zeroth order of the Bessel function of the first kind, $\tilde{\omega}_2$ is the average transition frequency of the tunable-frequency qubit device 312 under flux modulation during a period of time, $2\omega_p$ is the flux modulation frequency of the flux modulation signal communicated to the tunable-frequency qubit device 312, and $\Delta = \tilde{\omega}_2 - \omega_1$, where $\omega_1$ is the transition frequency of the fixed-frequency qubit device 314. In certain instances, an iSWAP gate may be implemented on the two qubit devices 312/314, when the average transition frequency of the tunable-frequency qubit device 312 is on resonance with the transition frequency of the fixed-frequency qubit device 314 for a half cycle of the oscillation of the population at the quantum state $|10\rangle$.

In some implementations, an iSWAP gate can be constructed by exponentiating a unitary operator shown below $$U = \exp(-iH\tau) \tag{2}$$

where $\tau$ is the duration (or gate time) of the iSWAP gate, and H is the Hamiltonian given in Equation (1). In some cases, the duration of the iSWAP gate is the time it takes for a half cycle of the oscillation of the population $|10\rangle$. When Z rotation operations are performed on the tunable-frequency qubit device 312 and the fixed-frequency qubit device 314, the unitary operator $$U_{iSWAP} = [[1, 0, 0, 0], [0, 0, i, 0], [0, i, 0, 0], [0, 0, 0, 1]] \tag{3}$$

where i is $\sqrt{-1}$.

In the case of an iSWAP gate, the logical states of the coupled system (e.g., the tunable-frequency qubit device 312 and the fixed-frequency qubit device 314 coupled by the fixed-frequency coupler device 352 in the example circuit 300 of FIG. 3) include $|01\rangle$, $|01\rangle$, $|10\rangle$, $|11\rangle$. Assume that the tunable-frequency qubit device 312 and the fixed-frequency qubit device 314 are initially evolving under the uncoupled Hamiltonian given by:

$$H_{lab} = \omega_1 |1\rangle\langle 1| \otimes I + \omega_2 I \otimes |1\rangle\langle 1| \tag{4}$$

where $H_{lab}$ is the uncoupled Hamiltonian, $\omega_1$ is the transition frequency of the fixed-frequency qubit device 314, $\omega_2$ is the transition frequency of the tunable-frequency qubit device 312, and I is an identity matrix.

In the doubly rotating frame, the wavefunction of the coupled system remains unchanged from its initial state, which is defined by:

$$|\psi(t_0)\rangle = c_{00}(0)|00\rangle + c_{01}(0)|01\rangle + c_{10}(0)|10\rangle + c_{11}(0)|11\rangle \tag{5}$$

where $c_{00}(0)$, $c_{01}(0)$, $c_{10}(0)$, and $c_{11}(0)$ are initial values ($t=t_0$) of respective probabilities of respective logical states. When an iSWAP gate is applied to the coupled system with the initial state, the probability amplitudes c01 and c10 are swapped. In the doubly rotating frame, the wavefunction of the coupled system is evolved to its final state defined by $$|\psi(t_f)\rangle = c_{00}(0)|00\rangle + ic_{01}e^{i\Delta t}|01\rangle + ic_{10}e^{-i\Delta t}|10\rangle + c_{11}(0)|11\rangle \tag{6}$$

where $\Delta t = t_f - t_0$.

As shown in Equation (6), after applying the iSWAP gate on the pair of qubits defined by the coupled qubit devices 312/314, local phases of the logical states $|01\rangle$ and $|10\rangle$ are shifted by $e^{i\Delta t}$ and $e^{-i\Delta t}$, respectively. In some implementations, the shifts in local phases, which are time-dependent, can be corrected by applying virtual Z rotation operations to the qubits before or after applying the iSWAP gate. For example, by generating and communicating qubit drive signals with negative phases to the two qubit devices to cancel the respective shifts in the local phases (e.g., local phase errors) caused by the application of the iSWAP gate.

In some examples, in order to obtain a reproducible iSWAP gate, the shifts in the local phases can be determined according to the example process 600 shown in FIG. 6 and corrected using virtual Z rotation operations. For example, phase tracking devices may be numerically controlled oscillator (NCO) devices which are associated with the qubit drive lines carrying qubit drive signals in the lab frame. In some instances, an NCO device is a digital generator circuit which generates a synchronous, discrete-time, discrete-valued representation of a waveform. In some examples, an NCO device can be used as a timer or a clock generator that uses the overflow of a phase accumulator to create an output signal at a precisely determined frequency. In this case, an NCO can output a clock signal, which can be used to determine time-dependent component of the shifts in local phases. In the case of the parametric resonance quantum logic gate in which the interaction is activated, the interaction Hamiltonian defined by Equation (1), does not depend on the phase of the flux modulation signals and thus does not need to be updated.

In some instances, in addition to the shifts in local phases introduced when an iSWAP gate is executed, shifts to the local phases can be also introduced by other operations. For example, a virtual Z rotation operation applied on a respective qubit defined by a respective qubit device includes an uncalibrated but constant relative phase between a respective qubit drive signal (e.g., generated by the qubit drive devices) and a respective flux modulation signal (e.g., generated by the AC+DC flux bias devices) communicated to the respective qubit device. Such constant phase shift is included in the time-independent component of the shifts to the local phases determined and thus, can be corrected using the methods and techniques presented here.

Figure 4:
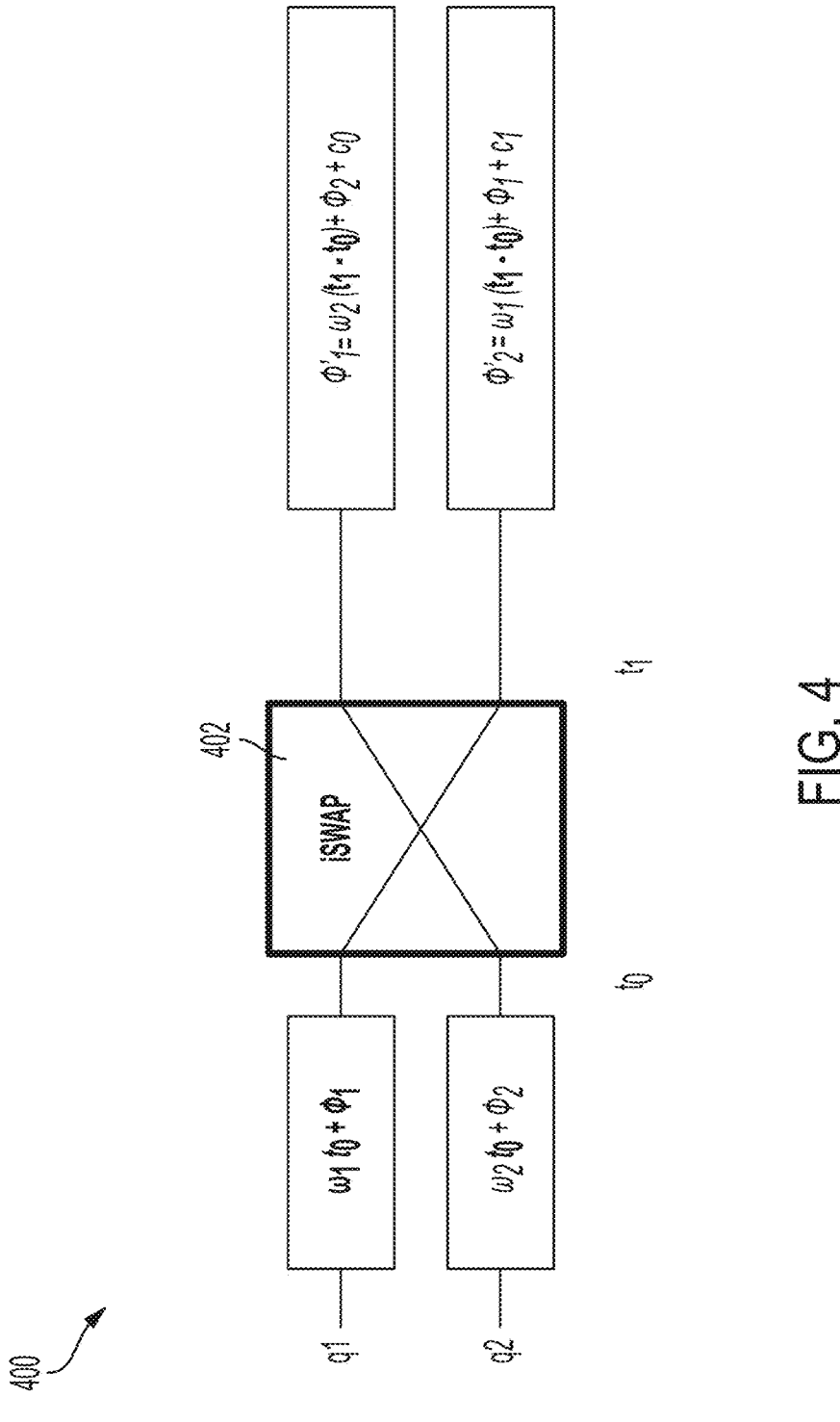
FIG. 4 is a block diagram showing an example quantum logic circuit.
Figure 5B:
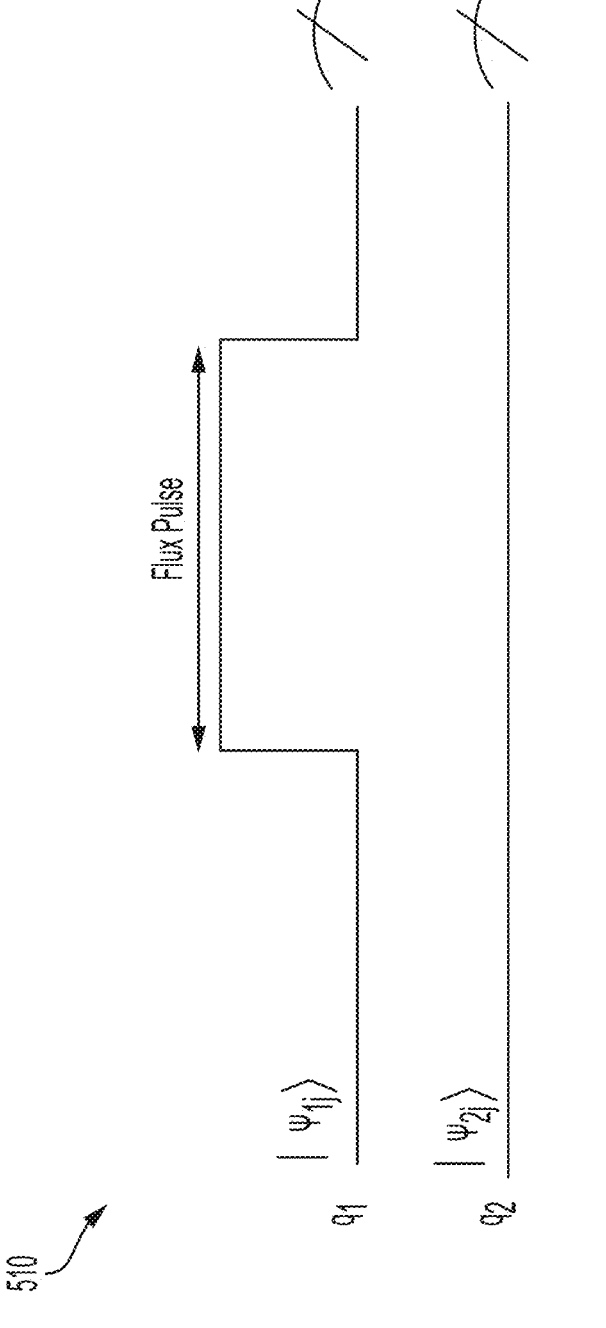

FIG. 4 is a block diagram showing an example quantum logic circuit 400. The quantum logic circuit 400 includes a sequence of quantum logic gates executed on qubits defined by qubit devices in a quantum processing unit. As shown in FIG. 4, the example quantum logic circuit 400 includes an iSWAP gate 402 executed on first and second qubits defined by first and second qubit devices q1 and q2 in an example quantum processing unit at a time step $t_0$ in the quantum logic circuit 400. In some instances, the first qubit device q1 can be implemented as the tunable-frequency qubit device 312 and the second qubit device q2 can be implemented as the fixed-frequency qubit device 314. In some implementations, in order to execute an iSWAP gate 402 on the qubit devices q1 and q2, an iSWAP flux pulse can be communicated to the first qubit device q1 on a flux bias control line. Example iSWAP flux pulses for executing an iSWAP gate is shown in FIGS. 5A-5B.

Prior to applying an iSWAP flux pulse at the time step $t_0$, the first qubit defined by the first qubit device q1 has a first initial phase of $\omega_1 t_0 + \phi_1$ and the second qubit defined by the second qubit device has a second initial phase of $\omega_2 t_0 + \phi_2$, where $\omega_1$ and $\omega_2$ are the transition frequencies of the first and second qubit devices, respectively. The application of the iSWAP gate results in the swapping of phases. At time step $t_1$, a first final phase of the first qubit defined by the first qubit device q1 is $\phi'_1 = \omega_2(t_1 - t_0) + \phi_2 + c_0$ and a second final phase of the second qubit defined by the second qubit device q2 is $\phi'_2 = \omega_1(t_1 - t_0) + \phi_1 + c_1$, where $c_0$ and $c_1$ are constant. In the electronics that generate the qubit drive signals, a clock or another type of phase tracking device associated with each qubit device allows one to track phases (or frequencies) accumulated on the qubit device during the execution of the iSWAP gate. Therefore, comparing the respective initial phases at $t_0$ and the respective final phases at $t_1$, a first shift in the local phase of the first qubit is $$\varphi_1 = (\omega_2 - \omega_1)(t_1 - t_0) + \phi_2 - \phi_1 + c_0, \qquad (7)$$

and a second shift in the local phase of the second qubit is $$\varphi_2 = (\omega_1 - \omega_2)(t_1 - t_0) + \phi_1 - \phi_2 + c_1. \qquad (8)$$

The first and second shifts in local phases of the first and second qubits can be compensated by adjusting phases of respective qubit drive signals communicated to the qubit devices, which is equivalent to virtually applying Z rotation operations to respective qubits, e.g., virtual Z rotation operations.

As shown in Equations (7) and (8), the first and second shift in local phases include respective time-dependent components and respective time-independent components. In particular, the first shift in the local phase of the first qubit includes a first time-dependent component $\omega_2(t_1 - t_0)$ and a first time-independent component $\phi_2 - \phi_1 + c_0$; and the second shift in the local phase of the second qubit includes a second time-dependent component $\omega_1(t_1 - t_0)$ and a second time-independent component $\phi_1 - \phi_2 + c_1$. In some implementations, phases of the virtual Z rotation operations that are needed to correct the shifts in local phases can be determined based on the results from a quantum process tomography (e.g., with respect to operation 606 of the example process 600). In some instances, phases of the virtual Z rotation operations can be determined in another manner. In particular, a respective phase tracking device can be configured to determine values of the first and second time-dependent components of the first and second shifts in local phases; and a quantum process tomography is configured to determine values of the first and second shifts in local phases. In some implementations, the first and second time-independent components (e.g., $\phi_2 - \phi_1 + c_0$ and $\phi_1 - \phi_2 + c_1$) of the first and second shifts in local phases (e.g., $\varphi_1$ and $\varphi_2$) can be determined by subtracting the values of the first and second time-dependent components (e.g., $(\omega_2 - \omega_1)(t_1 - t_0)$ and $(\omega_1 - \omega_2)(t_1 - t_0)$) from the values of the first and second shifts in local phases. In some implementations, the first and second time-independent components together with outputs of respective phase tracking devices at a time step, for example in a quantum program, are used to determine phases of virtual Z rotation operations when an iSWAP gate is applied to the qubits at that particular time step.

In some implementations, a quantum process tomography is used to experimentally measure the quality of gates, judging by how close the experimental implementation of the gate is to an ideal gate. During a quantum process tomography, an input state is prepared; a quantum logic gate is implemented; and an output state is measured. Different input states are prepared; and output states from implementing the same quantum logic gate are measured to determine a quantum process matrix for the quantum logic gate. For example, the quantum process matrix 700 of an iSWAP gate (e.g., a 16×16 matrix) shown in FIG. 7A can be determined.

In particular, 16 different initial states ($|\psi_j\rangle = |\psi_{1j}\rangle \otimes |\psi_{2j}\rangle$) are prepared and corresponding output states are measured after the application of an iSWAP flux pulse (e.g., the example iSWAP flux pulses in FIGS. 5A-5B). In some implementations, the phases of the virtual Z rotation operations can be obtained by post-processing the quantum process matrix. For example, the measured quantum process matrix can be compared with a true (e.g., an ideal) quantum process matrix of an iSWAP gate. In some implementations, by minimizing the overlap error between the true and measured quantum process matrices, values of the shifts in local phases are determined. In some implementations, values of the time-independent components of the shifts in local phases can be further determined, by subtracting the values of the time-dependent components determined using the phase tracking devices from the values of the shifts in local phases. The values of the shifts in local phases define the phases of the virtual Z rotation operations and thus, shifts to the drive phases of the respective qubit drive signals communicated to the respective qubit devices.

FIG. 5A is a schematic diagram 500 showing control signals communicated to qubit devices of an example quantum processing unit. In some implementations, the quantum processing unit is implemented as the example quantum processing unit 300, 1100 shown in FIGS. 3 and 11. The quantum processing unit includes a first qubit device (e.g., the tunable-frequency qubit device 312, 1102) and a second qubit device (e.g., the fixed-frequency qubit device 314, 1104) coupled to the first qubit device through a coupler device (e.g., the fixed-frequency coupler device 352 or the tunable-frequency coupler device 1106). The iSWAP flux pulse is communicated to the first qubit device on an associated control signal line (e.g., a flux modulation signal communicated on a flux modulation control line). The transition frequency of the first qubit device is tuned by modulating the qubit flux bias signal (flux pulses) applied on the first qubit device at a flux modulation frequency. In some instances, a flux modulation frequency of the flux modulation signal applied on the first qubit device can be the frequency difference between the transition frequencies of the first and second qubit devices. In some instances, the flux modulation frequency can be at a value such that a time average of the transition frequency of the first qubit device is on resonance with the transition frequency of the second qubit device.

FIG. 5B is a schematic diagram 510 showing control signals communicated to qubit devices of an example quantum processing unit. In some implementations, the quantum processing unit is implemented as the example quantum processing unit 300, 1100 shown in FIGS. 3 and 11. The quantum processing unit includes a first qubit device (e.g., the tunable-frequency qubit device 312, 1102) and a second qubit device (e.g., the fixed-frequency qubit device 314, 1104) coupled to the first qubit device through a coupler device (e.g., the fixed-frequency coupler device 352 or the tunable-frequency coupler device 1106). The control signals include fast-dc flux pulses which are communicated to the first qubit device on an associated control signal line (e.g., a flux bias signal communicated on a flux bias control line). The transition frequency of the first qubit device is tuned by the qubit flux bias signal (e.g., the fast-dc flux pulses) applied on the first qubit device. In some instances, the operating frequency of the first qubit device, higher than the operating frequency of the second qubit device, can be tuned to bring the qubits in to resonance.

In some implementations, when the qubit devices are coupled by a tunable-frequency coupler device in a superconducting quantum processing unit, control signals communicated to the superconducting quantum processing unit also include coupler flux bias control signals communicated to the tunable-frequency coupler device. For example, a coupler flux bias with a gate-activating value can be applied on the tunable-frequency coupler device to activate the coupling between the two qubit devices; and a coupler flux bias with a parking value can be applied on the tunable-frequency coupler device to deactivate the coupling between the two qubit devices.

FIG. 6 is a flow diagram showing aspects of an example process 600. The example process 600 can be implemented for calibration of a quantum logic gate to be executed by a quantum processing unit. In some implementations, the example process 600 is used for calibrating an iSWAP gate to determine values of one or more control parameters for executing the iSWAP gate. In the example process 600, an iSWAP gate calibrated for application to a pair of qubits defined by a first qubit device and a second qubit device in the quantum processing unit. In some instances, the first and second qubit devices may be implemented as the tunable-frequency qubit device 312 and the fixed-frequency qubit device 314 in the example quantum processing unit 300 or in another manner. In some instances, the first and second qubit devices are coupled through a fixed-frequency coupler device (e.g., the fixed-frequency coupler device 352 in the example quantum processing unit 300) or a tunable-frequency coupler device. The example process 600 may include additional or different operations, including operations performed by additional or different components, and the operations may be performed in the order shown or in another order.

In some implementations, the example process 600 is used to determine calibration parameters of an iSWAP gate. A calibration parameter of an iSWAP gate includes shifts in local phases, and may include other calibration parameters. The shifts in local phases are used to update phases of qubit drive signals of the first and second qubit devices to perform virtual Z rotation operations in order to correct the shifts in local phases when an iSWAP gate is applied. In other words, the calibration parameters obtained from the example process 600 can be used to update control parameters of the control signals when an iSWAP is applied, for example, in an execution of a quantum program.

In some implementations, one or more operations in the example process 600 can be performed by a computer system, for instance, by a digital computer system having one or more digital processors (e.g., a microprocessor or other data processing apparatus) that execute instructions (e.g., instructions stored in a digital memory or another computer-readable medium), or by another type of digital, quantum, or hybrid computer system. As an example, in some cases the quantum processing unit can be deployed as the quantum processing unit 102 shown in FIG. 1, and operations in the example process 600 shown in FIG. 6 can be initiated, executed, or controlled by one or more components of the control system 105 shown in FIG. 1.

At 602, initial values of control parameters for control signals for applying an iSWAP gate are obtained. In some instances, the iSWAP gate is implemented as a parametric resonance gate, and the control signals are configured to bring the first and second qubit devices into resonance. For instance, a parametric resonance gate can be activated when the first and second qubit devices are brought into resonance by modulating the transition frequency of the first qubit device (e.g., the tunable-frequency qubit device 312 in the example quantum processing unit 300) such that the average value of the transition frequency of the first qubit device in a time period is on resonance with the transition frequency of the second qubit device. In some instances, an iSWAP gate may be activated in another manner. In some implementations, the control parameters for the control signals include, the flux modulation amplitude and flux modulation frequency of a flux modulation signal, gate time, drive frequency, and drive phase of a qubit drive signal, or other control parameters for other control signals. For example, when a tunable-frequency coupler device is used to operably couple the two qubit devices, control parameters for the control signals for activating an iSWAP gate may include a flux bias amplitude of a coupler flux bias signal communicated to the tunable-frequency coupler device.

In some implementations, the initial values of the control parameters are determined according to values of device parameters. In some implementations, the values of the device parameters of a particular set of quantum circuit devices (e.g., the tunable-frequency qubit device 312, the fixed-frequency qubit device 314, and the fixed-frequency coupler device 352 in the quantum processing unit 300) where an iSWAP gate is executed, are determined by performing a measurement or characterization process, a device calibration process, a tune-up process, or another type of process. In some instances, a measurement process can characterize the particular set of quantum circuit devices in the quantum processing unit for performing the iSWAP gate. In some instances, the values of the device parameters may be pre-determined using another process and then can be stored in a memory device. In certain instances, a measurement process can be executed to characterize all the quantum circuit devices in a quantum processing unit to obtain the values of the device parameters of each of the quantum circuit devices in a device array, for example, once a quantum processing unit is cooled down.

In some instances, device parameters that can be used to characterize a tunable-frequency qubit device include a tunable range of transition frequencies. In certain examples, a tunable range of transition frequencies is defined by a maximal frequency value, e.g., the $|0\rangle \rightarrow |1\rangle$ transition frequency value at a magnetic flux of zero flux quantum applied to the tunable-frequency qubit device, $$\omega_{01}(\Phi = 0) \equiv \omega_{01}^{max} \qquad (9)$$

and a minimum frequency value, e.g., the $|0\rangle \rightarrow |1\rangle$ transition frequency value at a magnetic flux of half-flux quantum, $$\omega_{01}\left(\Phi = \frac{\Phi_0}{2}\right) \equiv \omega_{01}^{min} \qquad (10)$$

anharmonicity at the magnetic flux of zero flux quantum, $$\eta(\Phi = 0) \equiv \eta^{max} \qquad (11)$$

and the qubit flux bias $\Phi$, e.g., $$Q = Q(\omega_{01}^{max}, \omega_{01}^{min}, \eta^{max}, \Phi) \qquad (12)$$

In some implementations, the device parameters may include one or more of the device parameters of the tunable-frequency qubit device in the quantum processing unit. For example, device parameters, such as a maximum transition frequency $$\omega_{12}^{max},$$

and the anharmonicity ($\eta$) at $$\omega_{12}^{max},$$

can be used to characterize the qubit implementation beyond the lowest two states. In some instances, device parameters further include periodicity, coupling strengths, and other device parameters can be calibrated, measured, and stored, e.g., in a database of the memory 112 of the server 108. In certain instances, circuit parameters of circuit components in an equivalent circuit representing quantum circuit devices in the quantum processing unit can be calculated based on the device parameters.

In some examples, the transition frequency of a tunable-frequency qubit device from the ground state $|0\rangle$ to the first excited state $|1\rangle$ is measured by using qubit spectroscopy. Ramsey interferometry can then be used to fine tune the value of the transition frequency obtained from the spectroscopic measurement. In some instances, the transition frequency can be measured at one or more reference values of the applied magnetic flux. For example, the transition frequency of a tunable-frequency qubit device can be measured at zero flux and one-half flux quantum; the tunable-frequency qubit devices may be measured under other flux conditions.

In some examples, after the transition frequencies of the tunable-frequency qubit device are obtained, qubit spectroscopy can be used to measure the transition frequency from the ground state $|0\rangle$ to the second excited state $|2\rangle$ which can be used to calculate the anharmonicity of the tunable-frequency qubit device. For instance, the anharmonicity of a tunable-frequency qubit device may be computed as $\eta = 2\omega_{01} - \omega_{02}$, where $\omega_{01}$ represents the transition frequency from the ground state $|0\rangle$ to the first excited state $|1\rangle$ of the tunable-frequency qubit device, and $\omega_{02}$ represents the transition frequency from the ground state $|0\rangle$ to the second excited state $|2\rangle$ of the tunable-frequency qubit device.

In some implementations, the control signals include a flux bias signal that can be communicated to the tunable-frequency qubit device on a flux bias control line to tune the transition frequency. In some implementations, the control signals include a flux modulation signal which can be communicated to the tunable-frequency qubit device on a flux bias control line to modulate the transition frequency of the tunable-frequency qubit device. In certain instances, the control signals also include a qubit drive signal which can be communicated to the tunable-frequency qubit device on a distinct qubit drive line. The control signals (e.g., a flux bias signal, a flux modulation signal, a qubit drive signal, or another type of control signal) can be characterized by control parameters including modulation parameters such as a DC flux bias $\Phi_{dc}$, a flux modulation amplitude $\Phi_{ac}$, a flux modulation frequency $\omega_m$, a modulation phase $\theta_m$, and drive parameters, such as a drive amplitude $\Omega_d$, a drive frequency $\omega_d$, and a drive phase $\theta_d$. In certain examples, the device parameters obtained from the device measurement process can be used to determine initial values of the control parameters of the control signals that can be applied to the respective qubit devices. In some implementations, initial values of the drive phases of respective qubit drive signals are communicated to the respective qubit devices where the iSWAP gate is executed are determined. In some instances, the initial values of control parameters can be any current values of the control parameters at any time during the calibration process. For example, during a subsequent re-calibration process, the initial value of the control parameters may be the previous values of the control parameters determined in a previous calibration process.

At 604, frame tracking is configured. For example, a timekeeper (e.g., an internal clock of a phase tracking device or an NCO device) can be configured, and the accumulated phase (e.g., time-dependent components of the shifts in local phases) can be calculated according to the output of the time (t) and the device parameters of qubit devices (e.g., $$\omega_{01}^{max}$$

determined in operation 602), e.g., $$\omega_{01}^{max} \cdot t.$$

Due to the physical nature of the iSWAP interaction, frame tracking can be used to have the gate work as expected; a frame tracking process can track the phases accumulated on each single-qubit reference frame, and the phases of the qubit drive signals can be updated to account for those single-qubit phases. In some instances, the frame tracking may be performed by a complier, a scheduler, or both. During frame tracking, relative timings of the qubit drive signals may be provided and a shift on all the relevant frames may be determined according to the relative timings. In some implementations, certain aspects of frame tracking can be performed in software, hardware, firmware, or combinations thereof. Outputs of the frame tracking include time-dependent components of shifts in local phases and are used to update the drive phase of the qubit drive signals used to execute the iSWAP gate in hardware. In such implementations, the frame tracking is performed using frame tracking devices associated with respective qubit drive lines of respective qubit devices. In some examples, numerically defined oscillators (NCO) are used to perform frame tracking to determine the time-dependent components of the shifts in local phases.

At 606, a first quantum process tomography is performed and time-independent components of the shifts in local phases are determined. The first quantum process tomography is performed to determine the shifts in local phases of qubits. In some implementations, during the first quantum process tomography, 16 different initial states of the qubits are defined by generating qubit drive signals and an iSWAP flux pulse (e.g., flux modulation signals or fast-dc flux control signals as shown in FIGS. 5A-5B) using the initial values of the respective control parameters. The qubit drive signals are communicated from qubit drive devices to the respective qubit devices; and the iSWAP flux pulses are communicated from the flux bias devices to the respective qubit devices. A process tomography matrix is measured. In some implementations, values of the shifts in local phases are determined by comparing the measured process tomography matrix with the true process tomography matrix for an iSWAP gate. For example, the values of the shifts in local phases may be determined by optimizing overlap between the measured and true process tomography matrices for an iSWAP gate. In this case, the time-independent components of the shifts in local phases are further determined by subtracting the values of the time-dependent components determined by the phase tracking devices from the values of the shifts in local phases determined by the first quantum process tomography. In some instances, the time-independent components of the shifts in local phases may be determined by the measured process tomography matrix in another manner.

Figure 7A:
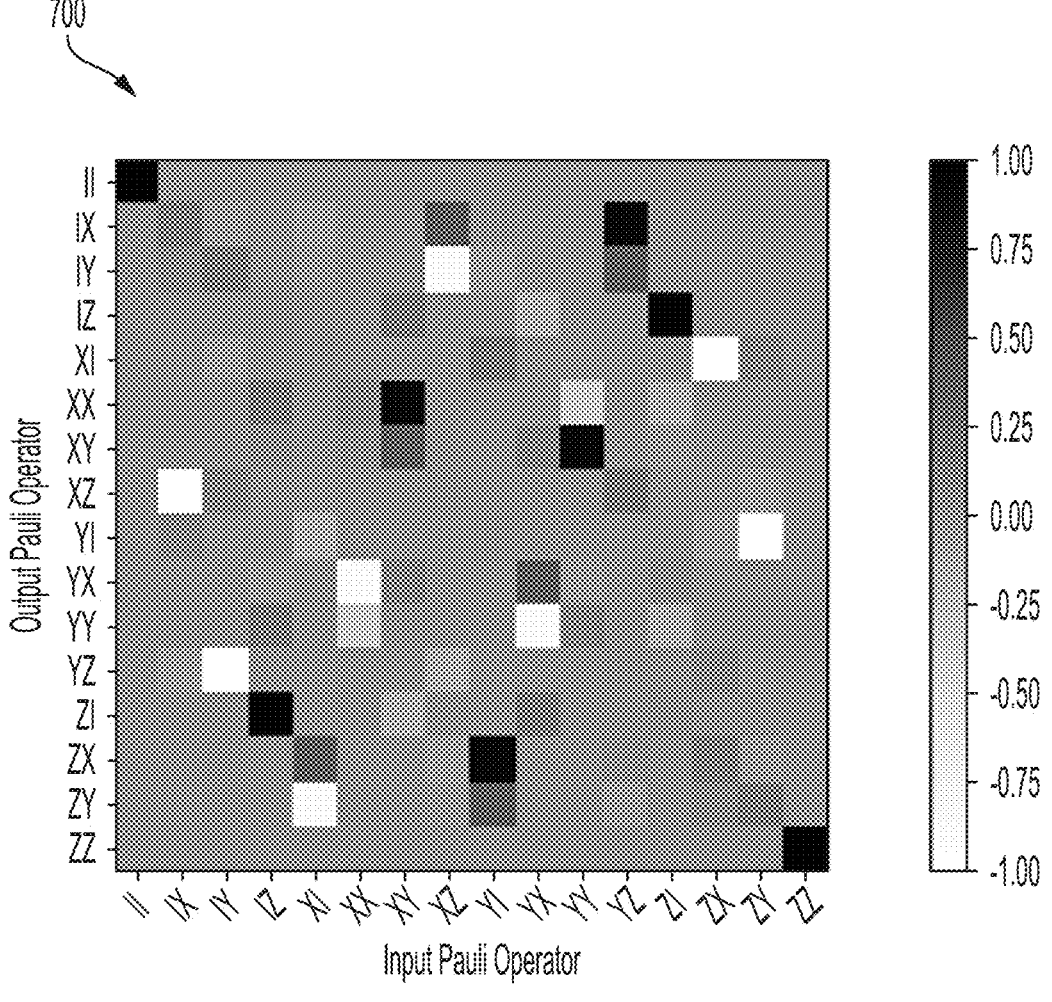
FIG. 7A is an example measured quantum process matrix for an iSWAP gate without correcting shifts in local phases.

FIG. 7A is an example measured process tomography matrix 700 for an iSWAP gate without correcting shifts in local phases. In some implementations, the example measured process tomography matrix 700 is obtained by performing the first quantum process tomography at operation 606 of the example process 600 on the first and second qubit devices 312/314 of the example quantum processing unit 300. The example measured process tomography matrix 700 shown in FIG. 7A can be compared with a true process tomograph matrix for an iSWAP gate. The iSWAP gate is applied to the qubits by communicating control signals with control parameters at their initial values to the qubit devices. In some implementations, the values of the shifts in local phases of qubits defined by the first and second qubit devices 312/314 can be determined by maximizing the process fidelity, e.g., $\varphi_1=1.66$ rad and $\varphi_2=-2.76$ rad.

At 608, values of the control parameters are updated according to the time-independent components of the shifts in local phases and outputs of the frame tracking. Specifically, values of drive phases of the respective qubit drive signals communicated to the first and second qubit devices 312/314 are updated according to the time-independent components of the shifts in local phases obtained in operation 606 and real-time outputs of the frame tracking at the time of the performance of the second tomography measurement. In some instances, the values of the drive phases of the respective qubit drive signals can be updated by swapping the local phases. For example, the first shift in local phase of the first qubit defined by the first qubit device 312 is the phase of the first virtual Z rotation operation applied on the first qubit and can be used to update the value of the first drive phase of the first qubit drive signal communicated to the first qubit device; and the second shift in local phase of the second qubit defined by the second qubit device 314 is the phase of the second virtual Z rotation operation applied on the second qubit and can be used to update the value of the second drive phase of the second qubit drive signal communicated to the second qubit device.

At 610, a second quantum process tomography is performed. In some implementations, the second quantum process tomography is performed after the shifts in local phases are determined to check if local phases errors are corrected. The second quantum process tomography is performed based on the updated values of the control parameters determined in operation 608. In particular, the updated values of the drive phases of the respective qubit drive signals are used in the second quantum process tomography. In some implementations, during the second quantum process tomography, 16 different initial states of the qubits are defined, and the iSWAP gate is applied to each of the initial states by generating and communicating the control signals with updated control parameters to the respective qubit devices. Final states of the qubits are measured, and a second process tomography matrix is measured. In some implementations, shifts in local phases that maximize the process fidelity between the second measured process tomography matrix and the true process tomography matrix for an iSWAP gate can be determined. In response to a determination that the shifts in local phases are approximately zero or negligibly small, e.g., less than a threshold value, e.g., 0.01 rad or another value, the local phases errors have been corrected and the example process 600 continues with operation 612.

In response to the determination that the shifts in local phases are equal to or greater than the threshold value, e.g., 0.01 rad or another value, the local phase errors have not been corrected and the example process 600 continues with operation 616 where a diagnostic process can be performed. For example, when the iSWAP flux pulse and the qubit drive signals are misaligned, which is caused by the hardware generating the control signals, local phase errors may not be determined and corrected by the example process 600. For another example, when a tunable-frequency coupler device is used to couple the two qubit devices, the iSWAP flux pulse and the flux control signals communicated to the tunable-frequency coupler device can be misaligned. In this case, local phase errors may not be determined and corrected by the example process 600. In this case, a diagnostic process of the control system that is used to generate the control signals can be performed. In some implementations, a calibration process to determine shifts in device parameters can be also performed. In some implementations, updated values of the control parameters to apply an iSWAP gate are determined based on the updated values of the device parameters. In certain instances, operation 616 may include other diagnostic procedures performed on other parts of the quantum computing system 200 to determine and correct other sources contributing to the local phase errors. For example, misalignment in control signals, e.g., between the RF pulse on the qubit drive line and the flux pulse communicated on the flux control line to respective qubit devices, between the flux pulses communicated to qubit devices and respective coupler device, or other misalignment of control signals, can be determined and corrected. In some implementations, no additional recalibration of the shifts in local phases is required within the retune window before another recalibration of the iSWAP gate is needed. Recalibrating the iSWAP gate can be performed according to the example process 600 and can be triggered when at least one predetermined criterion is met. For example, after a predetermined time of operation (e.g., a few hours, a few tens of hours, etc.), when the change in qubit device parameters (e.g., a shift in the qubit frequency is above a predetermined limit), or when the value of a readout fidelity is below a threshold value, a recalibration process with respect to the operations in the example process 600 can be triggered and performed. The example process 600 continues with operation 606, during which the first quantum process tomography of the iSWAP gate is performed using the updated values of the control parameters. In this case, updated values of the shifts in local phases of the pair of qubits can be determined based on the output of the first quantum process tomography of the iSWAP gate. Alternatively, after operation 616, a Ramsey-type measurement of the iSWAP gate can be performed, instead of performing the first quantum process tomography of the iSWAP gate. In some implementations, a Ramsey-type measurement of the iSWAP gate can be configured to measure local phases up to measurement error. In some instances, a Ramsey-type measurement of the iSWAP gate can be performed according to operations shown in FIGS. 13A, 13B or in another manner.

Figure 7B:
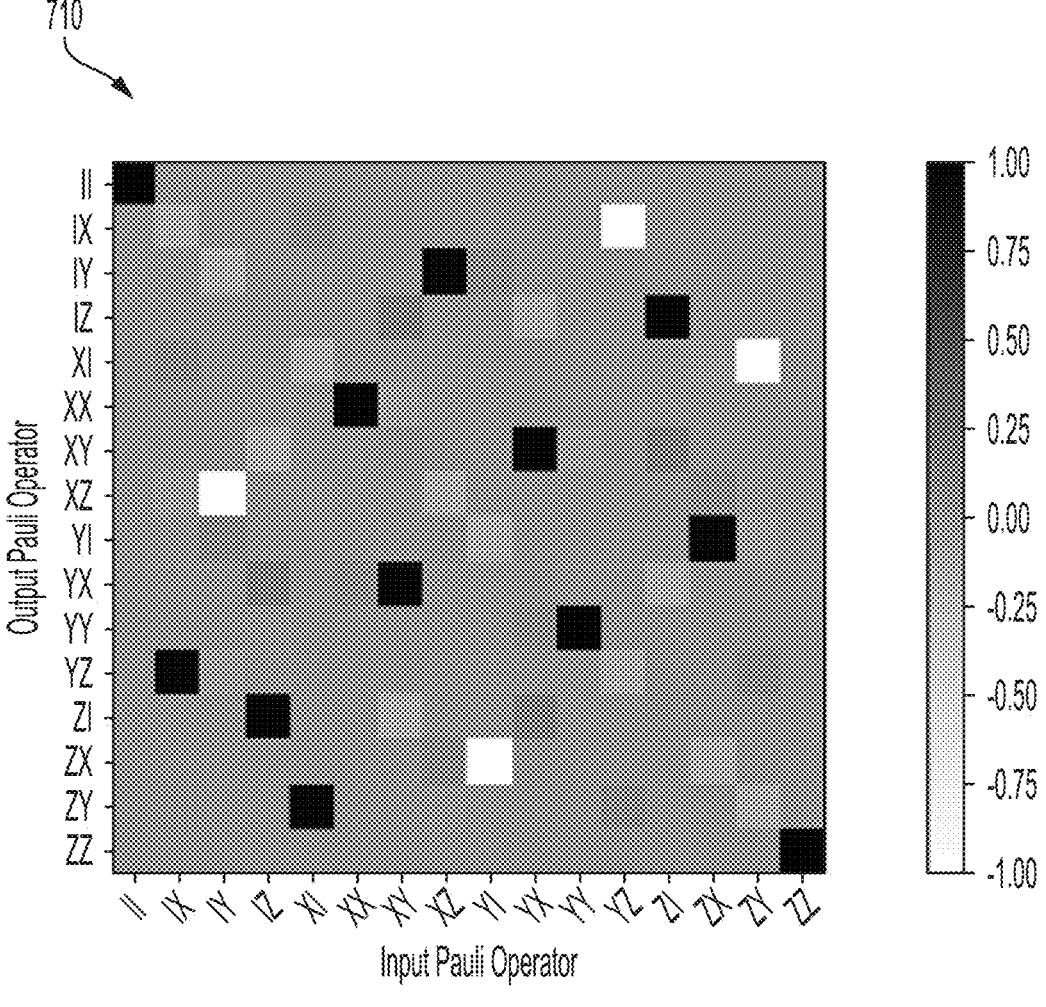
FIG. 7B is an example measured quantum process matrix for an iSWAP gate with corrected shifts in local phases.

FIG. 7B is an example measured process tomography matrix 710 for an iSWAP gate with corrected shifts in local phases. In some implementations, the example measured process tomography matrix 710 is obtained by performing the second quantum process tomography at operation 610 of the example process 600 on the first and second qubit devices 312/314 of the example quantum processing unit 300. During the second quantum process tomography, the updated values of the drive phases of the qubit drive signals are used. In other words, virtual Z rotation operations are applied on the respective qubit drive signals communicated to the respective qubit devices. In particular, a first Z rotation operation $Z_1$ with a first drive phase of $\varphi_1=1.66$ rad is communicated to the first qubit devices; and a second Z rotation operation $Z_2$ with a second drive phase of $\varphi_2=-2.76$ rad is communicated to the second qubit device. The example measured process tomography matrix 710 shown in FIG. 7B can be compared with a true process tomograph matrix for an iSWAP gate to determine shifts in local phases. The maximal fidelity of F=94%. If the shifts in local phases to maximize the fidelity have non-zero values and greater than a threshold value (e.g., >0.01 rad), another quantum process tomography can be performed to minimize the local phases.

At 612, a third quantum process tomography is performed. In some implementations, the third quantum process tomography is to further confirm the calibration of the iSWAP gate. During the third quantum process tomography, an iSWAP gate and an inverse of the iSWAP gate (e.g., $iSWAP^{-1}=iSWAP\otimes Z_1(\pi)\otimes Z_2(\pi)$) are applied on the qubits defined by the first and second qubit devices 312/314 in a sequence. Control signals with the updated values of the control parameters are communicated to the respective qubit devices and other quantum circuit devices to perform the iSWAP and inverse iSWAP gates. In particular, the updated values of the drive phases of the respective qubit drive signals are used in the third quantum process tomography. In some implementations, during the third quantum process tomography, 16 different initial states of the qubits are defined; a process of two quantum logic gates (e.g., an iSWAP gate followed by an $iSWAP^{-1}$ gate) are executed; and final states of the qubits are measured; and a third process tomography matrix is determined. The third measured process tomography matrix for the process (e.g., $iSWAP \cdot iSWAP^{-1}$) is compared with a true process tomography matrix for an identity gate. In response to the process fidelity being limited by fidelity values of the iSWAP gate at different initial states (e.g., a product of the respective fidelity values of the iSWAP gate and the respective fidelity values of the $iSWAP^{-1}$ gate at different initial states), the process 600 continues with operation 614 during which the updated values of the control parameters for applying the iSWAP gate are stored. In other words, when the iSWAP gate using the updated values of the control parameters is determined as repeatable, the control parameters of the control signals for applying the iSWAP gate on the qubit devices are stored in a memory unit of the control system. Once the iSWAP gate is calibrated and the calibrated values of the control parameters are determined and stored, the same iSWAP gate can be subsequently applied at a later time. When the performance of the subsequently performed iSWAP gate using the calibrated values of the control parameters is the same (e.g., up to a coherence-limited fidelity) as the iSWAP gate after its being calibrated without recalibration of local phase correction, the iSWAP gate is, thus, "repeatable".

In some implementations, values of the time-independent components are obtained from the example process 600, by subtracting the time-dependent components obtained from the phase tracking devices from the values of the shifts in local phases determined by the first quantum process tomography. In some implementations, the time-dependent components are stored in a memory unit of the control system and used to generate the updated values of the control parameters of the qubit drive signals communicated to the qubit devices. Whenever an iSWAP gate is applied at a time step (e.g., in a quantum program) on the qubits defined by the qubit devices, phases of the virtual Z rotation operations that are needed to correct the shifts in local phases can be determined according to outputs of the phase tracking devices at the particular time step and the time-independent components determined by performing the example process 600.

In response to a determination that the third measured process tomography matrix of $iSWAP \cdot iSWAP^{-1}$ is not approximately equal to a 2-qubit unitary, the example process 600 continues with operations 616 and 606, where the diagnostic process is performed to identify and correct other sources of local phase errors and perform the first quantum process tomography to determine the updated values of shifts in local phases.

Figure 7C:
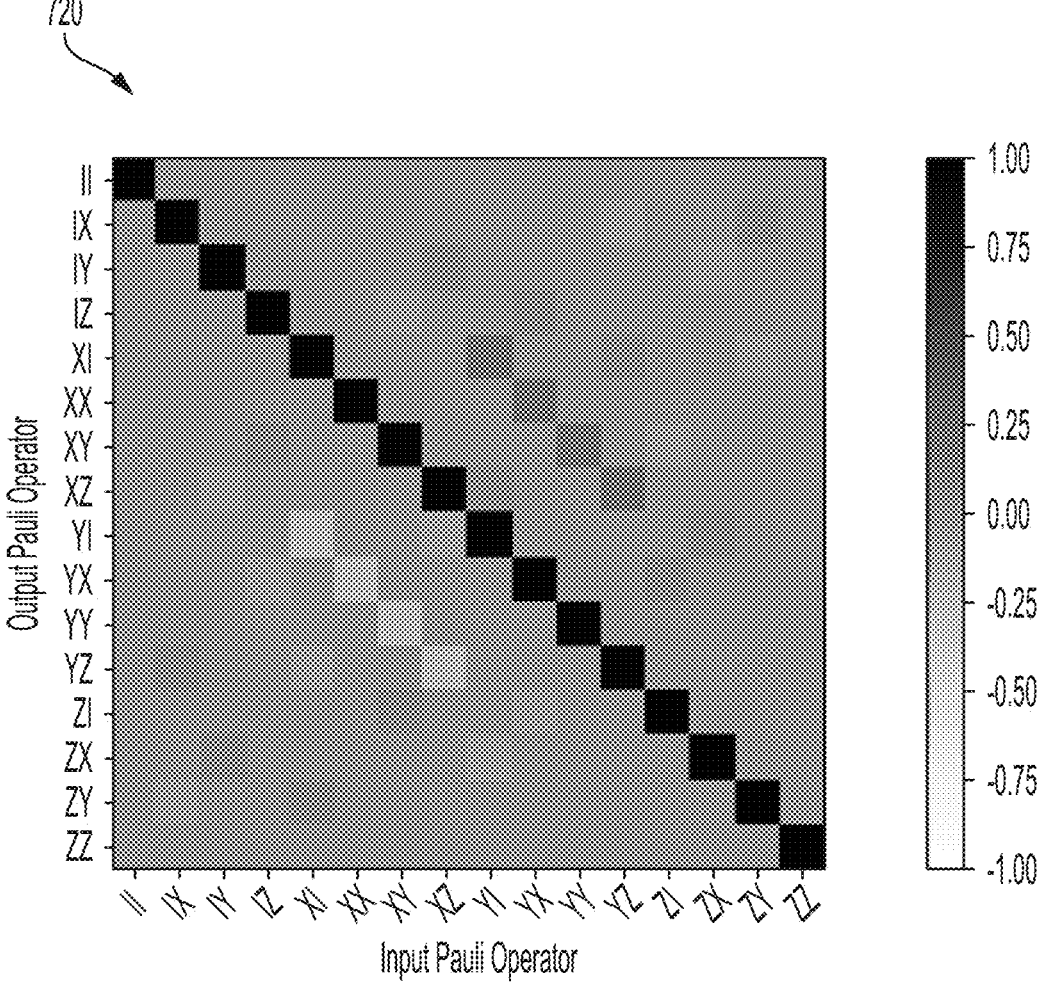
FIG. 7C is an example measured quantum process matrix for iSWAP⊗iSWAP$^{-1}$ gates with corrected shifts in local phases.

FIG. 7C is an example measured process tomography matrix 720 for $iSWAP \otimes iSWAP^{-1}$ gates with corrected shifts in local phases. In some implementations, the example measured process tomography matrix 720 is obtained by performing the third quantum process tomography at operation 612 of the example process 600 on the first and second qubit devices 312/314 of the example quantum processing unit 300. As shown in FIG. 7, the measured process tomography matrix 720 is identity-like, and the local phase errors are corrected, e.g., process fidelity values after performing the process (e.g., an iSWAP gate followed by an $iSWAP^{-1}$ gates) are greater than a threshold value. In some implementations, local phase errors are corrected if each fidelity value in the matrix is greater than the threshold value, e.g., the coherence-limited fidelity of the $iSWAP \cdot iSWAP^{-1}$. For example, if the coherent limit fidelity for a single iSWAP gate is 0.98, the coherence-limited fidelity of the $iSWAP \otimes iSWAP^{-1}$ is 0.98^2. In general, when the value of the fidelity of $iSWAP \cdot iSWAP^{-1}$ is 1, close to 1 (e.g., >0.95, >0.96, >0.97, >0.98, >0.99), close to the coherence-limited value, or another value, the local phases errors are corrected.

In some cases, operations 606, 608, 610, 612, and 616 (and possibly other operations) are executed as an iterative process, where each iteration includes determining whether the local phase errors are corrected and whether the iSWAP gate is repeatable; and determining the updated values of the control parameters for applying the iSWAP gate. When the local phase errors are corrected and the iSWAP gate is repeatable, the iterative process can terminate. The updated values of the control parameters are then stored in a database (e.g., in a memory unit of the control system 105 in FIG. 1). In some examples, the time-independent components of the shifts in local phases can be stored in the database. Each iteration of the iterative process may include additional operations and parameter evaluations.

Figure 8:
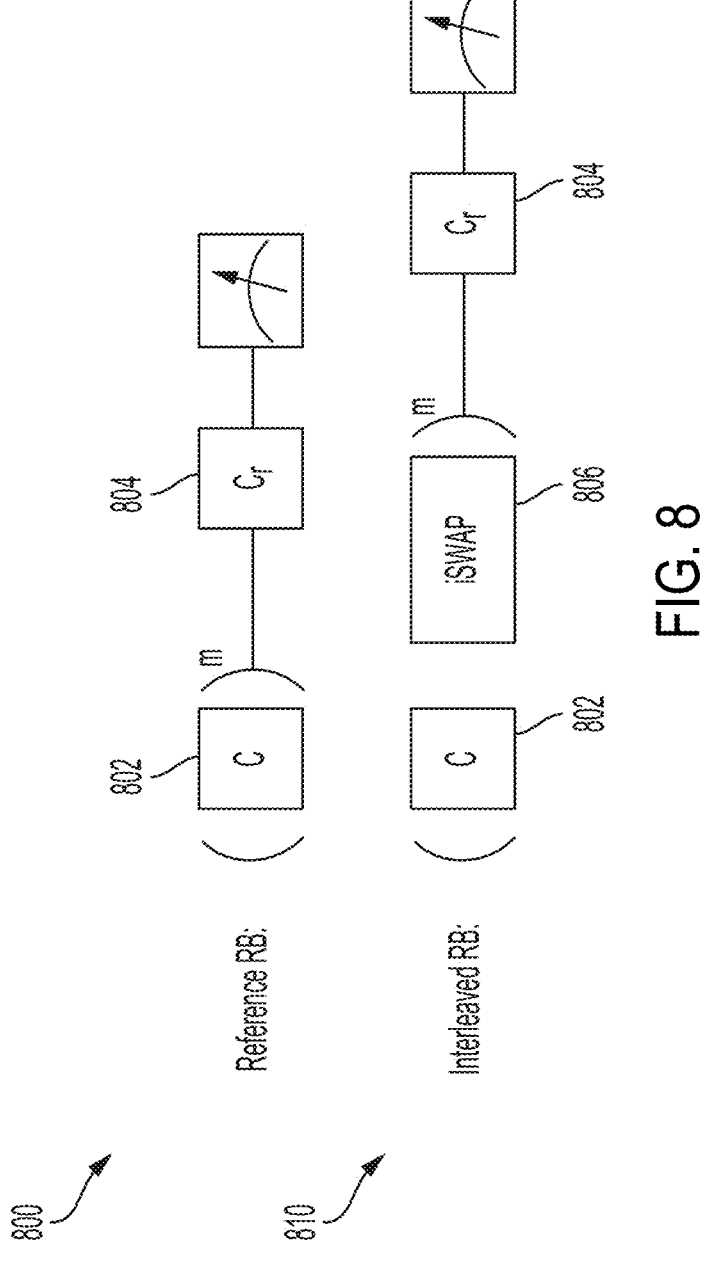
FIG. 8 shows schematic diagrams of example processes for randomized benchmarking.

FIG. 8 shows schematic diagrams of example processes 800, 810 for randomized benchmarking. In some implementations, the example processes 800, 810 are performed to validate the calibration of an iSWAP gate performed during the process 600. As shown in FIG. 8, the example processes 800, 810 are two sets of experiments of two-qubit randomized benchmarking (RB) to determine the performance of an iSWAP gate with corrected shifts in local phases. In a first process 800, also known as a reference RB, random Cliffords (C) 802 are applied m times, and a recovery Clifford ($C_r$) 804, which is the inverse of all Cliffords combined, is applied to undo all the Cliffords and bring the qubits to the ground state. The state of the qubits is measured at the end for each Clifford sequence m. The data (the reference sequence fidelity decay) is fitted to $$F_{ref} = A p_{ref}^m + B,$$

where $p_{ref}$ is the sequence decay, and state preparations and measurement errors are captured in parameters A and B. Then, the average error per Clifford of the reference is given by $r_{ref}=(1-p_{ref})(d-1)/d$ with $d=2^N$, where N is the number of qubits. In this case, N=2 and $d=2^2=4$. The reference fidelity is then $F_{ref}=1-r_{ref}$.

Figure 9:
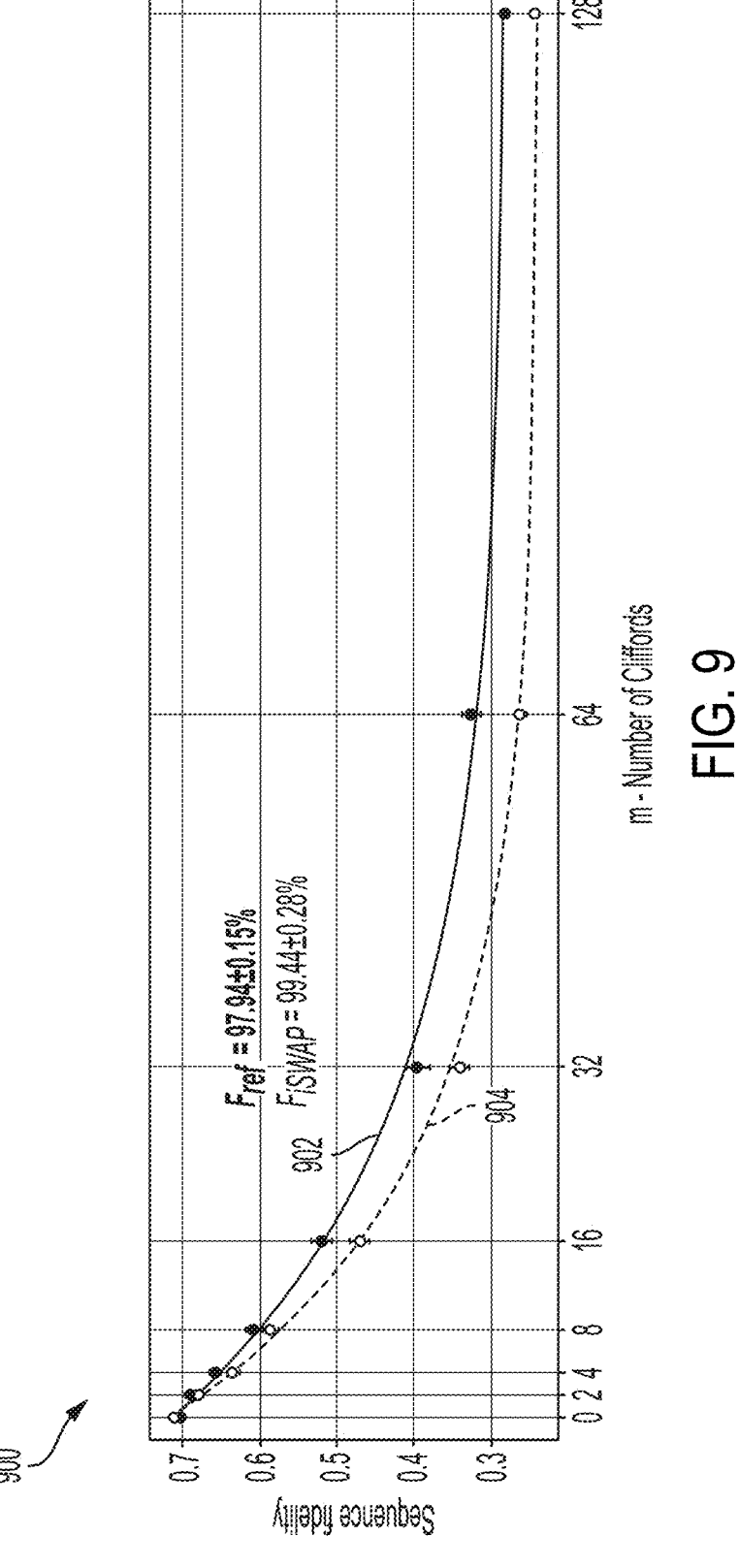
FIG. 9 is a plot showing sequence fidelity as a function of the number of Cliffords (m) during the randomized benchmarking measurement for an iSWAP gate.

In a second process 810, also known as an interleaved RB, the iSWAP gate 806 is interleaved with the random Cliffords (C) 802 for m times followed by the recovery Clifford ($C_r$) 804. The state of the qubits is measured at the end for each Clifford sequence m. The sequence decay $p_{iSWAP}$ then gives the iSWAP error $r_{iSWAP}=(1-p_{iSWAP}/p_{ref})(d-1)/d$. The fidelity of the iSWAP gate 806 is $F_{iSWAP}=1-r_{iSWAP}$. An example sequence fidelity measurement of an iSWAP gate as a function of the number of Cliffords using the example processes 800 and 810 is shown in FIG. 9. During the example processes 800, 810, the iSWAP gates are applied using the updated values of the control parameters determined with respect to the example process 600.

FIG. 9 is a plot 900 showing a sequence fidelity as a function of the number of Cliffords (m). The plot 900 includes a reference curve 902 and an interleaved curve 904. Data points in the plot 900 correspond to results of each individual trial. The reference and interleaved curves 902, 904 are fitted to an exponential decay. The iRB measurement shown in FIG. 9 is performed on the iSWAP gate applied by modulating a transition frequency of a qubit device using a flux modulation signal and applied using the updated values of the control parameters (e.g., the corrected drive phases of the qubit drive signals communicated to the qubit devices). The reference fidelity and the gate fidelity of the iSWAP gate can be determined, e.g., $F_{ref}=97.94\pm0.15\%$ and $F_{iSWAP}=99.44\pm0.28\%$.

Figure 10:
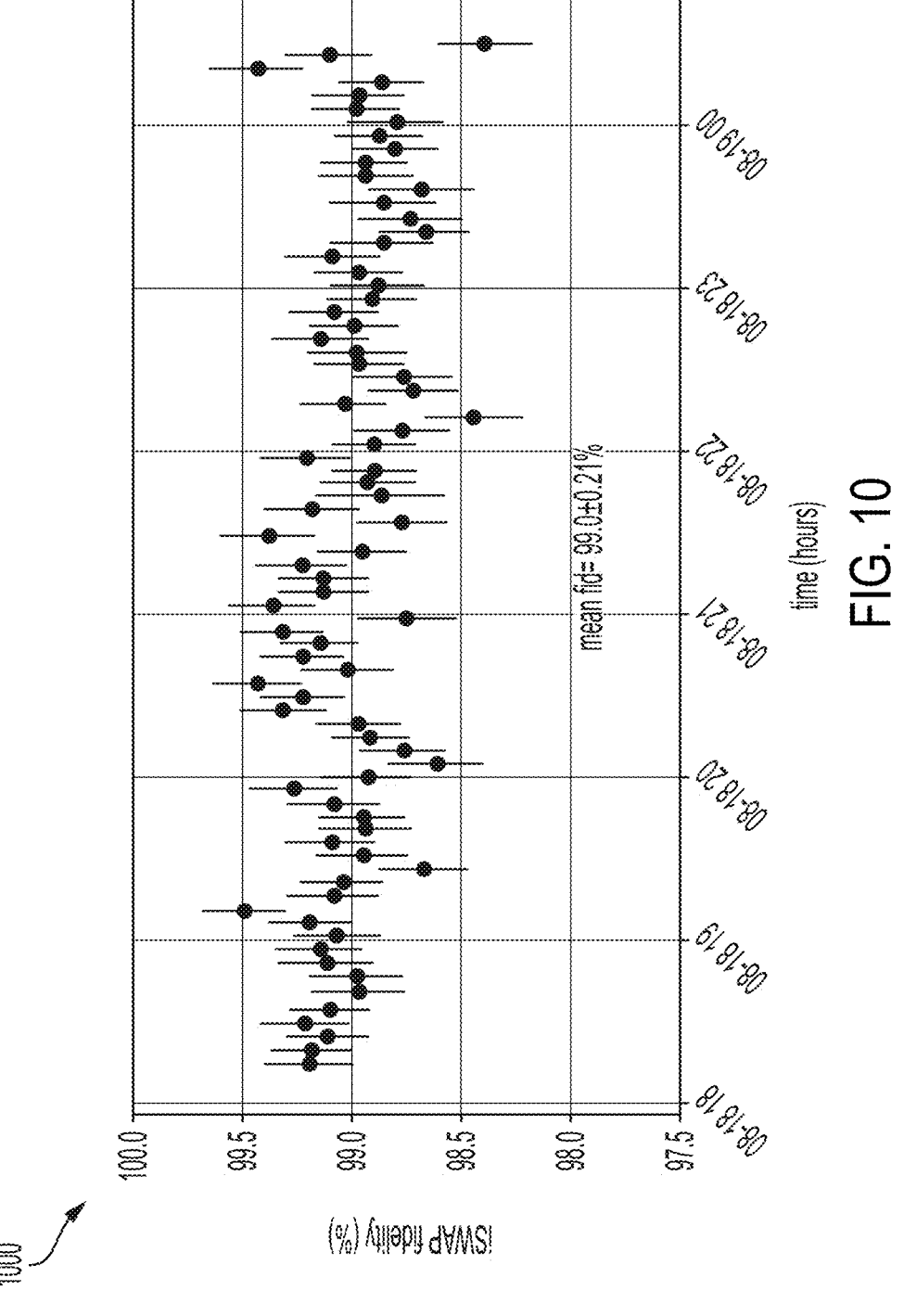
FIG. 10 is a plot showing gate fidelity of an iSWAP gate with corrected shifts in local phases as a function of time.

FIG. 10 is a plot 1000 showing gate fidelity of an iSWAP gate with corrected shifts in local phases as a function of time. The iSWAP gate is calibrated using the example process 600 of FIG. 6 and the fidelity values of the iSWAP gate applied using the updated values of control parameters is measured using the example processes 800, 810 of FIG. 8. Values of the gate fidelity of the iSWAP gate are stable during more than 6 hours of measurement, e.g., in a range of 98.2% and 99.8%. A mean value of the gate fidelity over the more than 6 hours of measurement is 99.0±0.21%.

Figure 11:
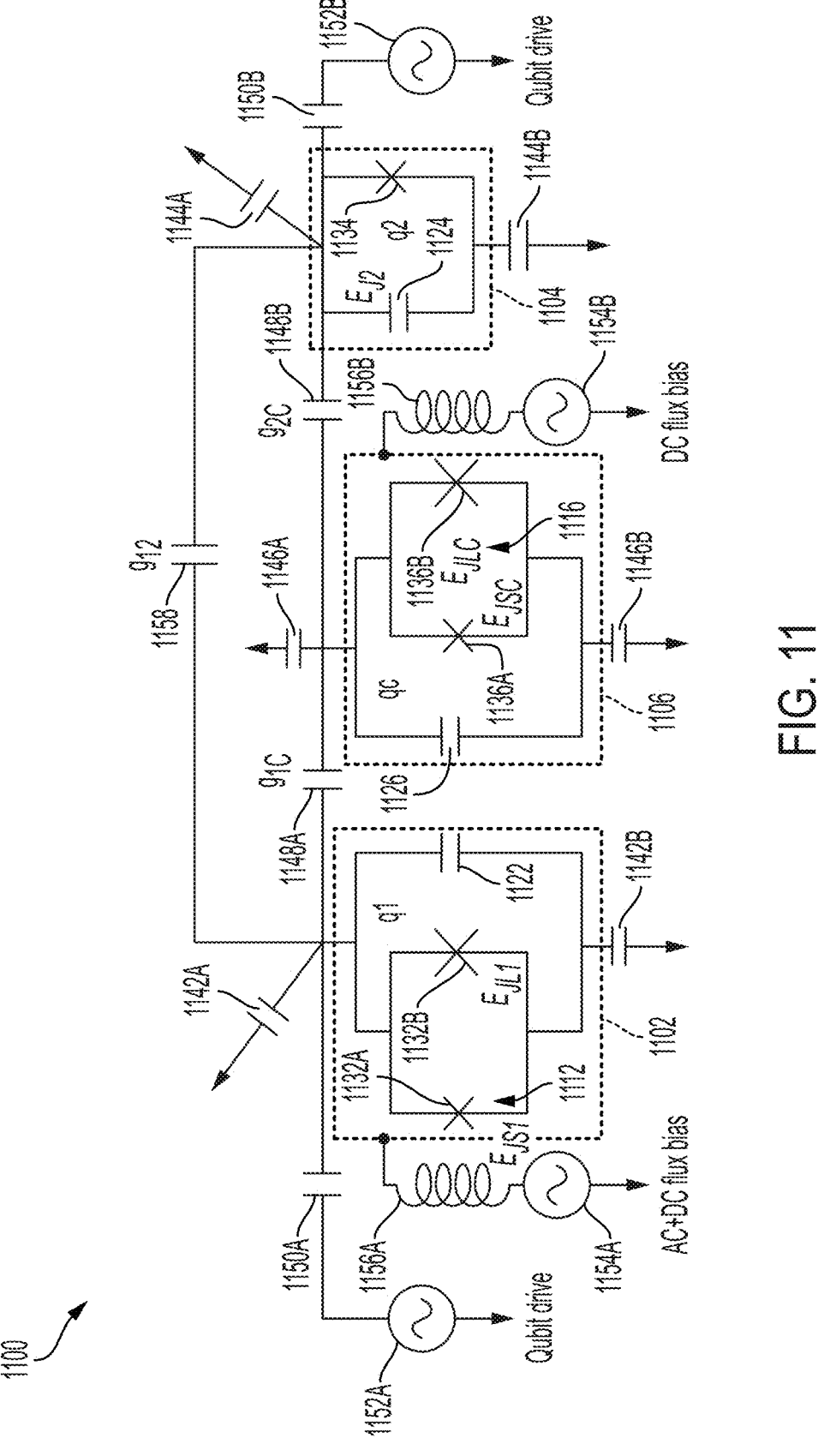
FIG. 11 is a circuit diagram showing an example equivalent circuit of an example superconducting circuit.

FIG. 11 is a circuit diagram showing an example equivalent circuit 1100 of an example superconducting circuit. The example equivalent circuit 1100 represented in FIG. 11 includes a tunable-frequency qubit device 1102, a fixed-frequency qubit device 1104, and a tunable-frequency coupler device 1106. For instance, the equivalent circuit 1100 in FIG. 11 can represent a pair of qubit devices 212B, 212C and the coupler device 214C in the superconducting quantum processing unit 204 in FIG. 2, or the equivalent circuit 1100 in FIG. 11 can represent devices in another type of system or environment.

In the example shown in FIG. 11, each of the tunable-frequency qubit device 1102 and the tunable-frequency coupler device 1106 is implemented as a tunable-frequency transmon qubit device. As shown, the tunable-frequency qubit device 1102 includes two Josephson junctions, e.g., a first Josephson junction 1132A and a second Josephson junction 1132B. The first and second Josephson junctions 1132A, 1132B having Josephson energies $E_{JS1}$ and $E_{JL1}$ are connected in parallel with each other to form a first superconducting circuit loop 1112. The tunable-frequency qubit device 1102 also includes a shunt capacitor 1122 with a capacitance $C_1$, which is connected in parallel with the two Josephson junctions 1132A, 1132B. The shunt capacitor 1122 is caused by two qubit electrodes of the tunable-frequency qubit device 1102.

The tunable-frequency coupler device 1106 includes two Josephson junctions, e.g., a third Josephson junction 1136A and a fourth Josephson junction 1136B. The third and fourth Josephson junctions 1136A, 1136B having Josephson energies $E_{JSC}$ and $E_{JLC}$ are connected in parallel with each other to form a third superconducting circuit loop 1116. The tunable-frequency coupler device 1106 also includes a shunt capacitor 1126 with a capacitance $C_C$, which is connected in parallel with the two Josephson junctions 1136A, 1136B. The shunt capacitor 1126 is caused by two electrodes of the tunable-frequency coupler device 1106. In this case, each of the two electrodes of the tunable-frequency coupler device 1106 is a capacitively coupled to the ground plane; and the tunable-frequency coupler device 1106 is electrically floating.

The fixed-frequency qubit device 1104 includes one Josephson junction, e.g., a fifth Josephson junction 1134. The fifth Josephson junction 1134 having a Josephson energy $E_{J2}$ is connected in parallel with a shunt capacitor 1124 with a capacitance $C_2$. The shunt capacitor 1124 is caused by two qubit electrodes of the fixed-frequency qubit device 1104.

In the example shown in FIG. 11, each of the tunable-frequency qubit device 1102, the fixed-frequency qubit device 1104, and the tunable-frequency coupler device 1106 is capacitively coupled to the ground plane through respective residual capacitors. Particularly, the tunable-frequency qubit device 1102 is coupled to the ground plane via residual capacitors 1142A, 1142B; the fixed-frequency qubit device 1104 is coupled to the ground plane via residual capacitors 1144A, 1144B; and the tunable-frequency coupler device 1106 is coupled to the ground plane via residual capacitors 1146A, 1146B.

As shown in FIG. 11, the tunable-frequency coupler device 1106 is capacitively coupled to each of the tunable-frequency qubit device 1102 and the fixed-frequency qubit device 1104 via respective residual capacitors. Particularly, the tunable-frequency coupler device 1106 is coupled to the tunable-frequency qubit device 1102 via a residual capacitor 1148A; and the tunable-frequency coupler device 1106 is coupled to the fixed-frequency qubit device 1104 via a residual capacitor 1148B. The residual capacitors 1148A, 1148B represent the indirect capacitive coupling component between the tunable-frequency qubit device 1102 and the fixed-frequency qubit device 1104. Further, the tunable-frequency qubit device 1102 and the fixed-frequency qubit device 1104 are also capacitively coupled to each other via a residual capacitor 1158. Therefore, the residual capacitor 1158 represents the direct capacitive coupling component the tunable-frequency qubit device 1102 and the fixed-frequency qubit device 1104.

In some implementations, control operations can be performed on the superconducting circuit by providing control signals to the tunable-frequency qubit device 1102 and the fixed-frequency qubit device 1104 and the tunable-frequency coupler device 1106 via control signal lines. The control signal lines can receive the control signals, for example, from an external control system. In some implementations, each of the control signal lines can be connected to a conductor, an inductor, or another type of circuit component configured to carry a respective current I from a respective current source 1154A, 1154B, which generates a respective magnetic flux $\Phi(t)$ through the superconducting circuit loops 1112, 1116. For instance, the control line may include an inductor 1156A, 1156B (e.g., a partial loop, a single loop, or multiple loops of a conductor) that has a mutual inductance with the respective superconducting circuit loop 1112, 1116. In the example shown, the transition frequency of the tunable-frequency qubit device 1102 is tuned by tuning a flux bias in the first superconducting circuit loop 1112; and the transition frequency of the tunable-frequency coupler device 1106 is tuned by tuning a magnetic flux in the second superconducting circuit loop 1116. In some instances, the transition frequencies may be controlled in another manner, for instance, by another type of control signal. In some implementations, the control signal lines may be connected to an inductance loop or another type of flux bias element that is coupled (e.g., conductively, capacitively, or inductively) to a control port to receive control signals. In certain instances, the control signals on the control signal lines may cause the flux bias element to generate and modulate the magnetic flux in the superconducting circuit loop 1112, 1116. In some implementations, the control signals on the control signal lines are flux bias signals or flux modulation signals, and are implemented as the control signals are communicated on the control signal lines 206 as shown in FIG. 2.

In some implementations, when the tunable-frequency qubit device 1102 and the fixed-frequency qubit device 1104 are coupled through the tunable-frequency coupler device 1106, the coupling between the tunable-frequency qubit device 1102 and the fixed-frequency qubit device 1104 can be enabled/disabled by tuning a coupler flux bias applied to the tunable-frequency coupler device 1106. For example, a separate control signal (e.g., a DC or an AC current) can be applied to a control line to tune the coupler flux bias threading to the superconducting circuit loop 1116 of the tunable-frequency coupler device 1106 to adjust the transition frequency of the tunable-frequency coupler device 1106. When the coupler flux bias on the tunable-frequency coupler device 1106 is at a parking value, the coupling between the two tunable-frequency qubit devices 1102, 1104 can be turned off or deactivated. When the coupler flux bias on the tunable-frequency coupler device 1106 is at a gate-activating value, the coupling the tunable-frequency qubit device 1102 and the fixed-frequency qubit device 1104 can be activated for performing a two-qubit quantum logic gate.

In some implementations, the tunable-frequency qubit device 1102 includes highly asymmetric Josephson junctions (e.g., $E_{JS1} \ll E_{JL1}$) that form the superconducting circuit loop 1112. The tunable-frequency coupler device 1106 includes symmetric Josephson junctions or asymmetric Josephson junctions. In some implementations, a tunable-frequency coupler device 1106 with asymmetric Josephson junctions allows for the operating of two-qubit quantum logic gates by tuning the transition frequency of the tunable-frequency coupler device 1106 to a minimal value to obtain gate stability against flux fluctuations. The strong asymmetry can result in much smaller tunability of the tunable-frequency qubit device 1102 than that of the tunable-frequency coupler device 1106. The systems and techniques presented here can reduce sensitivity of the tunable-frequency qubit device 1102 to flux noise thereby improving their coherence times.

In some implementations, when the tunable-frequency coupler device 1106 is in the ground state, the net qubit-qubit system can be described by the following Hamiltonian:

$$H = \omega_1 |1\rangle\langle 1| \otimes I + \omega_2 I \otimes |1\rangle\langle 1| + g(|01\rangle\langle 10| + |10\rangle\langle 01|) \qquad (13)$$

where $$g = g_{12} - \frac{1}{2} g_{1c} g_{2c} \left( \frac{1}{\omega_c - \omega_1} + \frac{1}{\omega_c - \omega_2} + \frac{1}{\omega_c + \omega_1} + \frac{1}{\omega_c + \omega_2} \right) \qquad (14)$$

where g is the effective qubit-qubit coupling; $g_{12}$ is the direct qubit-qubit coupling via the residual capacitor 1158; $g_{1c}$ is the coupling between the tunable-frequency coupler device 1106 and the tunable-frequency qubit device 1102 via the residual capacitor 1148A; $g_{2c}$ is the coupling between the tunable-frequency coupler device 1106 and the fixed-frequency qubit device 1104 via the residual capacitor 1148B; and $\omega_j$ (j=1, 2, c) are the respective transition frequencies of the tunable-frequency qubit device 1102, the fixed-frequency qubit device 1104, and the tunable-frequency coupler device 1106.

In some implementations, a two-qubit quantum logic gate can be applied to qubits defined by the tunable-frequency qubit device 1102 and the fixed-frequency qubit device 1104 of the example superconducting quantum processing unit 1100. In some instances, a flux modulation signal can be generated and communicated to the tunable-frequency qubit device 1102. The flux modulation signal is configured to modulate a transition frequency of the tunable-frequency qubit device 1102 such that an average frequency of the tunable-frequency qubit device 1102 over a duration of the flux modulation signal is on resonance with the transition frequency of the fixed-frequency qubit device 1104 in the superconducting quantum logic circuit 1100. In some instances, the coupler flux bias applied on the tunable-frequency coupler device can be tuned from a parking value to a gate-activating value to enable fast gates. The parking value of the transition frequency is the frequency at which the net qubit-qubit coupling g=0 (Equation 14). In some implementations, an iSWAP gate can be calibrated on the qubit devices 1102, 1104 coupled by the tunable-frequency qubit devices 1106 of the superconducting quantum processing unit 1100 with respect to the operations in the example process 600 as shown in FIG. 6 or in another manner.

FIG. 12 is a flow diagram showing aspects of an example process 1200 for iSWAP gate calibration. The example process 1200 can be implemented for calibration of a quantum logic gate to be executed by a quantum processing unit. In some implementations, the example process 1200 is used for calibrating an iSWAP gate to determine values of one or more control parameters for executing the iSWAP gate. In the example process 1200, an iSWAP gate calibrated for application to a pair of qubits defined by a first qubit device and a second qubit device in the quantum processing unit. In some instances, the first and second qubit devices may be implemented as the tunable-frequency qubit device 312 and the fixed-frequency qubit device 314 in the example quantum processing unit 300 or in another manner. In some instances, the first and second qubit devices are coupled through a fixed-frequency coupler device (e.g., the fixed-frequency coupler device 352 in the example quantum processing unit 300) or a tunable-frequency coupler device. The example process 1200 may include additional or different operations, including operations performed by additional or different components, and the operations may be performed in the order shown or in another order.

In some implementations, the example process 1200 is used to determine calibration parameters of an iSWAP gate. A calibration parameter of an iSWAP gate includes shifts in local phases, and may include other calibration parameters. The shifts in local phases are used to update phases of qubit drive signals of the first and second qubit devices to perform virtual Z rotation operations in order to correct the shifts in local phases when an iSWAP gate is applied. In other words, the calibration parameters obtained from the example process 1200 can be used to update control parameters of the control signals when an iSWAP is applied, for example, in an execution of a quantum program.

In some implementations, one or more operations in the example process 1200 can be performed by a computer system, for instance, by a digital computer system having one or more digital processors (e.g., a microprocessor or other data processing apparatus) that execute instructions (e.g., instructions stored in a digital memory or another computer-readable medium), or by another type of digital, quantum, or hybrid computer system. As an example, in some cases the quantum processing unit can be deployed as the quantum processing unit 102 shown in FIG. 1, and operations in the example process 1200 shown in FIG. 12 can be initiated, executed, or controlled by one or more components of the control system 105 shown in FIG. 1.

At 1202, initial values of control parameters for control signals for applying an iSWAP gate are obtained. At 1204, frame tracking is configured. In some examples, numerically defined oscillators (NCO) are used to perform frame tracking to determine the time-dependent components of the shifts in local phases. In some implementations, operations 1202 and 1204 are implemented as the operations in 602, 604 in the example process 600 or in another manner.

Figure 13A:
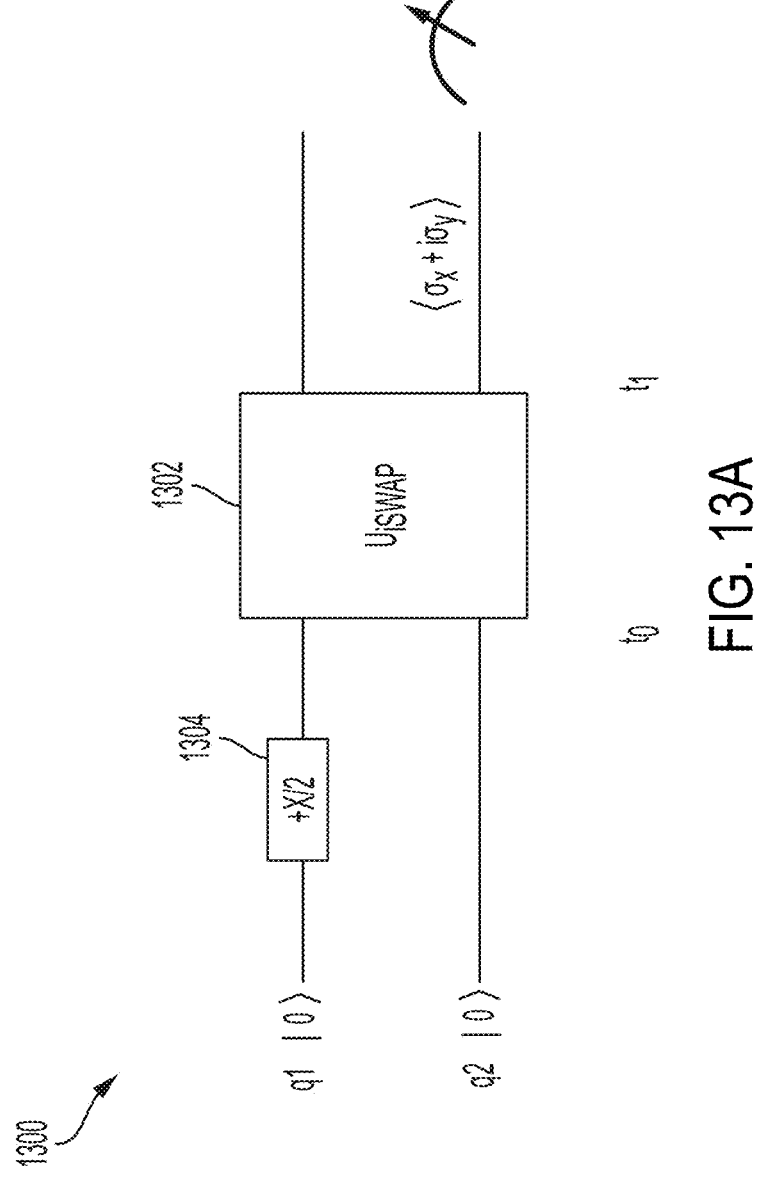
FIGS. 13A-13B are block diagrams showing example quantum logic circuits for Ramsey-type measurements.
Figure 13B:
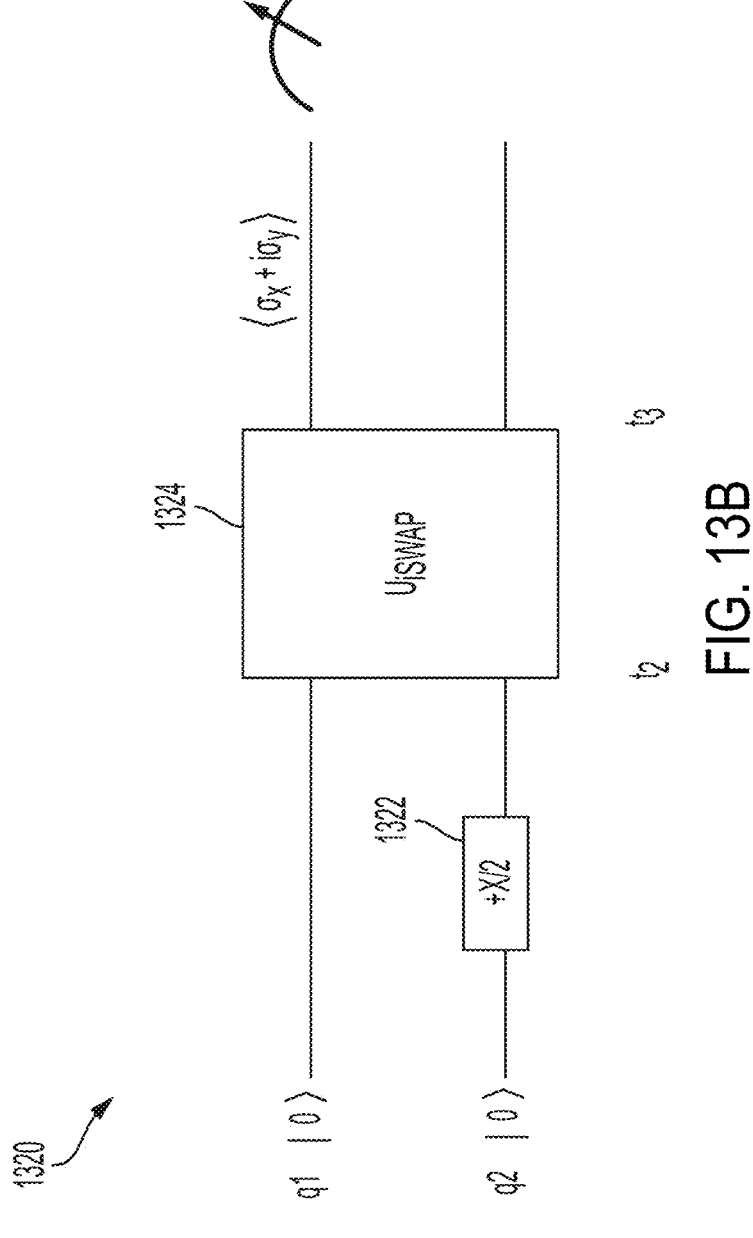

At 1206, Ramsey-type measurements are performed, and time-independent components of the shifts in local phases are determined. The Ramsey-type measurements are performed to determine the shifts in local phases of qubits. In some implementations, to obtain a Ramsey-type measurement, both qubits are initialized to an initial state (e.g., the ground state), and a π/2 rotation (e.g., about the X or Y axis) is applied to one of the qubits (e.g., by applying qubit drive signals or other control signals). Then, an iSWAP gate is applied to the qubits (e.g., by applying flux modulation signals or fast-dc flux control signals as shown in FIGS. 5A-5B) using the initial values of the respective control parameters. After the iSWAP gate is applied, one or both of the qubits can be measured to obtain the Ramsey-type measurements. For instance, the local phase acquired by the qubit to which the π/2 rotation was not applied can be determined from a measurement of that qubit in a particular basis (e.g., the basis $\sigma_x + i\sigma_y$). Examples of Ramsey-type measurements are shown in FIGS. 13A-13B. The time-independent component of each qubit's local phase can then be determined from the difference between the time-dependent component (obtained from the output of the phase tracking devices) and the total local phase acquired by the qubit (obtained from the Ramsey-type measurement).

FIG. 13A is a block diagram showing an example quantum logic circuit 1300 that can be used to obtain a Ramsey-type measurement of a local qubit phase. The example quantum logic circuit 1300 includes a sequence of quantum logic gates executed on qubits defined by qubit devices in a quantum processing unit. In some implementations, the example quantum logic circuit 1300 is used to determine a local phase of the first qubit. As shown in FIG. 13A, the example quantum logic circuit 1200 includes an iSWAP gate 1202 executed on first and second qubits defined by first and second qubit devices q1 and q2 in an example quantum processing unit at a time $t_0$ in the quantum logic circuit 1200. In some instances, the first qubit device q1 can be implemented as the tunable-frequency qubit device 312 and the second qubit device q2 can be implemented as the fixed-frequency qubit device 314. In some implementations, to execute an iSWAP gate 1202 on the qubit devices q1 and q2, an iSWAP flux pulse can be communicated to the first qubit device q1 on a flux bias control line. Example iSWAP flux pulses for executing an iSWAP gate are shown in FIGS. 5A-5B.

Prior to applying an iSWAP flux pulse at the time $t_0$, the qubits are initialized in their ground state $|00\rangle$, and an X/2 pulse 1304 is applied to qubit 1 (q1). The iSWAP flux pulse is then applied to the qubit with higher frequency to activate the iSWAP interaction. The output state at time $t_1$ can be described as $$|\psi\rangle = U_{iSWAP}\left(\frac{X}{2} \otimes I\right)|\psi_0\rangle.$$

Then, the second qubit (q2) is measured in the basis defined by $\sigma_x + i\sigma_y$. The measurement result ($u_{11}$) is related to the local phase acquired by the qubit q1. In this example, the local phase is given by $\phi_1 = \pi - \arg(u_{11})$, where $$u_{11} == \langle I \otimes (\sigma_x + i\sigma_y)\rangle = \langle\psi|I \otimes (\sigma_x + i\sigma_y)|\psi\rangle = -ie^{i\phi_1} \qquad (15)$$

FIG. 13B is a block diagram showing an example quantum logic circuit 1320 that can be used to obtain a Ramsey-type measurement of a local qubit phase. The example quantum logic circuit 1320 includes a sequence of quantum logic gates executed on qubits defined by qubit devices in a quantum processing unit. In some implementations, the example quantum logic circuit 1320 is used to determine a local phase of the second qubit. As shown in FIG. 13B, the example quantum logic circuit 1320 includes an iSWAP gate 1322 executed on first and second qubits defined by first and second qubit devices q1 and q2 in an example quantum processing unit at a time $t_2$ in the quantum logic circuit 1320. In some instances, the first qubit device q1 can be implemented as the tunable-frequency qubit device 312 and the second qubit device q2 can be implemented as the fixed-frequency qubit device 314. In some implementations, to execute an iSWAP gate 1322 on the qubit devices q1 and q2, an iSWAP flux pulse can be communicated to the first qubit device q1 on a flux bias control line. Example iSWAP flux pulses for executing an iSWAP gate are shown in FIGS. 5A-5B.

Prior to applying an iSWAP flux pulse at the time $t_2$, the qubits are initialized in their ground state $|00\rangle$, and an X/2 pulse 1324 is applied on qubit 2 (q2). The iSWAP interaction is then activated by applying a modulated flux pulse on the first qubit device q1. The output state at time $t_3$ can be described as $$|\psi\rangle = U_{iSWAP}\left(\frac{X}{2}\otimes I\right)|\psi_0\rangle.$$

Then, the first qubit device q1 is measured in the $\sigma_x + i\sigma_y$ basis. The measurement result ($u_{22}$) is related to the local phase acquired by qubit 2. In this example, the local phase is given by $\phi_2 = \pi - \arg(u_{22})$, where $$u_{22} = \langle(\sigma_x + i\sigma_y)\otimes I\rangle = \langle\psi|I\otimes(\sigma_x + i\sigma_y)|\psi\rangle = -ie^{i\phi_2}. \quad (16)$$

In some implementations, values of the shifts in local phases are determined by subtracting the local phases determined by the Ramsey-type measurement and the initial phases of respective qubits. In this case, the time-independent components of the shifts in local phases are further determined by subtracting the values of the time-dependent components determined by the phase tracking devices from the values of the shifts in local phases determined by the Ramsey-type measurement.

At 1208, values of the control parameters are updated according to the time-independent components of the shifts in local phases and outputs of the frame tracking. In some implementations, the operation 1208 may be implemented as the operation 608 of the process 600 in FIG. 6. At 1210, a first quantum process tomography is performed. In some implementations, the operation 1210 may be implemented as the operation 610 of the process 600 in FIG. 6. In response to the determination that the shifts in local phases are equal to or greater than the threshold value, e.g., 0.01 rad or another value, the local phase errors have not been corrected and the example process 1200 continues with operation 1216 where a diagnostic process can be performed. In some implementations, the operation 1216 may be implemented as the operation 616 of the process 600 in FIG. 6.

At 1212, a second quantum process tomography is performed. In some implementations, the operation 1212 may be implemented as the operation 612 of the process 600 in FIG. 6. In response to a determination that a second measured process tomography matrix of iSWAP·iSWAP$^{-1}$ is not approximately equal to a 2-qubit unitary, the example process 1200 continues with operations 1216 and 1206, where the diagnostic process is performed to identify and correct other sources of local phase errors and perform the Ramsey-type measurement to determine the updated values of shifts in local phases.

In some cases, operations 1206, 1208, 1210, 1212, and 1216 (and possibly other operations) are executed as an iterative process, where each iteration includes determining whether the local phase errors are corrected and whether the iSWAP gate is repeatable; and determining the updated values of the control parameters for applying the iSWAP gate. When the local phase errors are corrected and the iSWAP gate is repeatable, the iterative process can terminate. The updated values of the control parameters are then stored in a database (e.g., in a memory unit of the control system 105 in FIG. 1). In some examples, the time-independent components of the shifts in local phases can be stored in the database. Each iteration of the iterative process may include additional operations and parameter evaluations.

Some of the subject matter and operations described in this specification can be implemented in digital electronic circuitry, or in computer software, firmware, or hardware, including the structures disclosed in this specification and their structural equivalents, or in combinations of one or more of them. Some of the subject matter described in this specification can be implemented as one or more computer programs, i.e., one or more modules of computer program instructions, encoded on a computer storage medium for execution by, or to control the operation of, data-processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media.

Some of the operations described in this specification can be implemented as operations performed by a data processing apparatus on data stored on one or more computer-readable storage devices or received from other sources.

The term "data-processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

In a general aspect, iSWAP gates applied on a superconducting quantum processing unit are calibrated.

In a first example, a method of calibrating an iSWAP gate for a superconducting quantum processing unit is disclosed. Initial values of control parameters to apply the iSWAP gate on a pair of qubits defined by first and second qubit devices of the superconducting quantum processing unit are identified by operation of a control system communicably coupled to the superconducting quantum processing unit. Phase tracking devices associated with the first and second qubit devices of the superconducting quantum processing unit are initiated. After initiating the phase tracking devices, shifts in local phases of the pair of qubits are determined based on one or more applications of the iSWAP gate to the pair of qubits. The one or more applications of the iSWAP gate to the pair of qubits is performed using the initial values of the control parameters. Updated values of one or more of the control parameters to apply the iSWAP gate are generated based on the shifts in local phases and outputs of the phase tracking devices.

Implementations of the first example may include one or more of the following features. Determining the shifts in local phases of the pair of qubits based on one or more applications of the iSWAP gate to the pair of qubits includes performing a quantum process tomography of the iSWAP gate applied to the pair of qubits; and determining the shifts in local phases of the pair of qubits based on an output of the quantum process tomography of the iSWAP gate. The quantum process tomography of the iSWAP gate is performed using the initial values of the control parameters. When the initial values of the control parameters are identified, first values of the control parameters are received. The first values are stored in a memory unit of the control system. When the updated values are generated, second values for the one or more of the control parameters are computed based on the shifts in local phases. The second values are stored in the memory unit of the control system. The first qubit device is a tunable-frequency qubit device. When the iSWAP gate is applied, a flux modulation signal is communicated to the tunable-frequency qubit device. The control parameters for applying the iSWAP gate includes a flux modulation amplitude of the flux modulation signal, a flux modulation frequency of the flux modulation signal, and a duration of the flux modulation signal.

Implementations of the first example may include one or more of the following features. The first and second qubit devices are operably coupled by a tunable-frequency coupler device. When the iSWAP gate is applied, a flux bias is applied to the tunable-frequency coupler device. The control parameters for applying the iSWAP gate includes a gate-activating value of the flux bias to activate a coupling between the first and second qubit devices. The phase tracking devices include numerically controlled oscillators.

Implementations of the first example may include one or more of the following features. When the iSWAP gate is applied, qubit drive signals are communicated to the first and second qubit devices. The shifts in local phases include a first phase error for the first qubit device and a second phase error for the second qubit device. When the updated values of the one or more of the control parameters are generated, phases of the qubit drive signals are updated based on the first phase error, the second phase error, and the outputs of the phase tracking devices. The quantum process tomography of the iSWAP gate using the initial values of the control parameters includes a first quantum process tomography. After generating the updated values of the one or more of the control parameters, a second quantum process tomography of the iSWAP gate is performed using the updated values of the one or more of the control parameters. Based on an output of the second quantum process tomography, whether the first phase error and the second phase error have been corrected is determined. In response to determining that the first and second phase errors have been corrected, a third quantum process tomography of an identity gate is performed using the updated values of the control parameters. The identity gate includes the iSWAP gate and an inverse of the iSWAP gate applied on the first and second qubits in sequence. Based on an output of the third quantum process tomography, whether the iSWAP gate using the updated values of the one or more of the control parameters is repeatable is determined. The initial values of the control parameters are determined based on values of device parameters determined using a calibration process. In response to determining that the iSWAP gate is not repeatable, the calibration process is performed to determine updated values of the device parameters; and a diagnostic process is performed to determine and correct misalignments of control signals communicated to the first and second qubit devices. A fourth quantum process tomography of the iSWAP gate is performed using a new set of values of the one or more of the control parameters based on the updated values of the device parameters. Updated values of the shifts in local phases of the pair of qubits are determined based on an output of the fourth quantum process tomography of the iSWAP gate and outputs of the phase tracking devices.

In a second example, a quantum computing system includes a superconducting quantum processing unit and a control system. The superconducting quantum processing unit includes a first qubit device and a second qubit device. The control system is communicably coupled to the superconducting quantum processing unit. The control system is configured to perform one or more operations of the first example.

In a third example, a quantum computing system includes a superconducting quantum processing unit including first and second qubit devices and means for calibrating an iSWAP gate for the first and second qubit devices.

Implementations of the third example may include one or more of the following features. the means for calibrating the iSWAP gate includes a control system of the superconducting quantum computing system, and the control system includes phase tracking devices associated with the first and second qubit devices.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple implementations separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made.

What is claimed is:

1. A method of calibrating an iSWAP gate for a superconducting quantum processing unit, the method comprising:

by operation of a control system communicably coupled to the superconducting quantum processing unit, identifying initial values of control parameters to apply the iSWAP gate on a pair of qubits defined by first and second qubit devices of the superconducting quantum processing unit;

initiating phase tracking devices associated with the first and second qubit devices of the superconducting quantum processing unit;

after initiating the phase tracking devices, determining shifts in local phases of the pair of qubits based on one or more applications of the iSWAP gate to the pair of qubits, wherein the one or more applications of the iSWAP gate to the pair of qubits are performed using the initial values of the control parameters;

obtaining outputs of the phase tracking devices; and generating updated values of one or more of the control parameters to apply the iSWAP gate based on the shifts in local phases and the outputs of the phase tracking devices.

2. The method of claim 1, wherein determining the shifts in local phases of the pair of qubits based on the one or more applications of the iSWAP gate to the pair of qubits comprises:

performing a quantum process tomography of the iSWAP gate applied to the pair of qubits, wherein the quantum process tomography of the iSWAP gate is performed using the initial values of the control parameters; and determining the shifts in local phases of the pair of qubits based on an output of the quantum process tomography of the iSWAP gate.

3. The method of claim 2, wherein applying the iSWAP gate comprises communicating qubit drive signals to the first and second qubit devices, the shifts in local phases comprise a first phase error for the first qubit device and a second phase error for the second qubit device, and generating the updated values of the one or more of the control parameters comprises updating phases of the qubit drive signals based on the first phase error, the second phase error, and the outputs of the phase tracking devices.

4. The method of claim 3, wherein the quantum process tomography of the iSWAP gate using the initial values of the control parameters comprises a first quantum process tomography, and the method comprises:

after generating the updated values of the one or more of the control parameters, performing a second quantum process tomography of the iSWAP gate using the updated values of the one or more of the control parameters; and based on an output of the second quantum process tomography, determining whether the first phase error and the second phase error have been corrected.

5. The method of claim 4, comprising:

in response to determining that the first and second phase errors have been corrected, performing a third quantum process tomography of an identity gate using the updated values of the one or more of the control parameters, wherein the identity gate comprises the iSWAP gate and an inverse of the iSWAP gate; and based on an output of the third quantum process tomography, determining whether the iSWAP gate using the updated values of the one or more of the control parameters is repeatable.

6. The method of claim 5, wherein the initial values of the control parameters are determined based on values of device parameters determined using a device calibration process, and the method further comprises:

in response to determining that the iSWAP gate is not repeatable, performing the device calibration process to determine updated values of the device parameters;

performing a diagnostic process to determine and correct misalignments of control signals communicated to the first and second qubit devices;

performing a fourth quantum process tomography of the iSWAP gate using a new set of values of the one or more of the control parameters based on the updated values of the device parameters; and determining updated values of the shifts in local phases of the pair of qubits based on an output of the fourth quantum process tomography of the iSWAP gate and the outputs of the phase tracking devices.

7. The method of claim 1, wherein the outputs of the phase tracking devices represent local phases accumulated by the respective qubits during application of the iSWAP gate.

8. The method of claim 1, wherein identifying the initial values of the control parameters comprises:

receiving first values of the control parameters; and storing the first values in a memory unit of the control system.

9. The method of claim 8, wherein generating the updated values comprises:

computing second values for the one or more of the control parameters based on the shifts in local phases; and storing the second values in the memory unit of the control system.

10. The method of claim 1, wherein the first qubit device is a tunable-frequency qubit device, applying the iSWAP gate comprises communicating a flux modulation signal to the tunable-frequency qubit device, and the control parameters to apply the iSWAP gate comprise:

a flux modulation amplitude of the flux modulation signal;

a flux modulation frequency of the flux modulation signal; and a duration of the flux modulation signal.

11. The method of claim 1, wherein the first and second qubit devices are operably coupled by a tunable-frequency coupler device, applying the iSWAP gate comprises applying a flux bias to the tunable-frequency coupler device, and the control parameters to apply the iSWAP gate comprise a gate-activating value of the flux bias to activate a coupling between the first and second qubit devices.

12. The method of claim 1, wherein the phase tracking devices comprise numerically controlled oscillators.

13. The method of claim 1, wherein determining the shifts in local phases of the pair of qubits based on the one or more applications of the iSWAP gate to the pair of qubits comprises:

performing a Ramsey-type measurement of the iSWAP gate applied to the pair of qubits, wherein the Ramsey-type measurement of the iSWAP gate is performed using the initial values of the control parameters; and determining the shifts in local phases of the pair of qubits based on an output of the Ramsey-type measurement of the iSWAP gate.

14. A quantum computing system, comprising:

a superconducting quantum processing unit comprising first and second qubit devices; and a control system, communicably coupled to the quantum processing unit, the control system configured to:

identify initial values of control parameters to apply an iSWAP gate on a pair of qubits defined by the first and second qubit devices;

initiate phase tracking devices associated with the first and second qubit devices;

after initiating the phase tracking devices, determine shifts in local phases of the pair of qubits based on one or more applications of the iSWAP gate to the pair of qubits, wherein the one or more applications of the iSWAP gate to the pair of qubits are performed using the initial values of the control parameters;

obtain outputs of the phase tracking devices; and generate updated values of one or more of the control parameters to apply the iSWAP gate based on the shifts in local phases and the outputs of the phase tracking devices.

15. The quantum computing system of claim 14, wherein determining the shifts in local phases of the pair of qubits based on one or more applications of the iSWAP gate to the pair of qubits comprises:

performing a quantum process tomography of the iSWAP gate applied to the pair of qubits, wherein the quantum process tomography of the iSWAP gate is performed using the initial values of the control parameters; and determining the shifts in local phases of the pair of qubits based on an output of the quantum process tomography of the iSWAP gate.

16. The quantum computing system of claim 15, wherein applying the iSWAP gate comprises communicating qubit drive signals to the first and second qubit devices, the shifts in local phases comprise a first phase error for the first qubit device and a second phase error for the second qubit device, and generating the updated values of the one or more of the control parameters comprises updating phases of the qubit drive signals based on the first phase error, the second phase error, and the outputs of the phase tracking devices.

17. The quantum computing system of claim 16, wherein the quantum process tomography of the iSWAP gate using the initial values of the control parameters comprises a first quantum process tomography, and the control system is configured to:

after generating the updated values of the one or more of the control parameters, perform a second quantum process tomography of the iSWAP gate using the updated values of the one or more of the control parameters; and based on an output of the second quantum process tomography, determine whether the first phase error and the second phase error have been corrected.

18. The quantum computing system of claim 17, wherein the control system is configured to:

in response to determining that the first and second phase errors have been corrected, perform a third quantum process tomography of an identity gate using the updated values of the control parameters, wherein the identity gate comprises the iSWAP gate and an inverse of the iSWAP gate; and based on an output of the third quantum process tomography, determine whether the iSWAP gate using the updated values of the one or more of the control parameters is repeatable.

* * * * *